US011885904B2

(12) United States Patent
Bohaichuk et al.

(10) Patent No.: US 11,885,904 B2
(45) Date of Patent: Jan. 30, 2024

(54) SENSING PULSES OF RADIO FREQUENCY FIELDS

(71) Applicant: Quantum Valley Ideas Laboratories, Waterloo (CA)

(72) Inventors: Stephanie M. Bohaichuk, Waterloo (CA); Donald Booth, Kitchener (CA); Kent Arnold Nickerson, Waterloo (CA); Ching Tai, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 18/068,146

(22) Filed: Dec. 19, 2022

(65) Prior Publication Data

US 2023/0296658 A1   Sep. 21, 2023

Related U.S. Application Data

(60) Provisional application No. 63/293,450, filed on Dec. 23, 2021.

(51) Int. Cl.
*G01S 7/285* (2006.01)
*G01R 29/08* (2006.01)
(Continued)

(52) U.S. Cl.
CPC .......... *G01S 7/285* (2013.01); *G01R 29/0885* (2013.01); *G01R 29/0892* (2013.01); *G01R 33/26* (2013.01); *H04B 10/70* (2013.01)

(58) Field of Classification Search
CPC .................. G01R 29/0885; G01R 29/0892
(Continued)

(56) References Cited

U.S. PATENT DOCUMENTS 10,509,065 B1 *   12/2019   Shaffer .............. G01R 29/0885
10,605,840 B1      3/2020   Amarloo et al.
(Continued)

FOREIGN PATENT DOCUMENTS

WO          2020140148          7/2020

OTHER PUBLICATIONS

WIPO, International Search Report and Written Opinion dated Mar. 14, 2023, in PCT/CA2022/051862, 8 pgs.
(Continued)

*Primary Examiner* — Christopher P McAndrew
(74) *Attorney, Agent, or Firm* — Henry Patent Law Firm PLLC

(57) ABSTRACT

In a general aspect, a system for sensing pulses of radio frequency (RF) fields includes a laser system and a vapor cell sensor. The laser system is configured to generate beams of light that include a probe beam of light. The vapor cell sensor has a vapor therein and is configured to allow the beams of light to pass through the vapor. The system also includes an optical detector configured to generate a detector signal based on the probe beam of light. The system includes a signal processing system configured to perform operations that include receiving the detector signal from the optical detector over a time period. The operations also include generating a digital signal based on the detector signal and applying a matched filter to the digital signal to generate a filtered signal. The filtered signal is processed to determine properties of an RF field experienced by the vapor.

30 Claims, 17 Drawing Sheets

(51) Int. Cl.
  *G01R 33/26* (2006.01)
  *H04B 10/70* (2013.01)
(58) Field of Classification Search
  USPC .......................................................... 324/96
  See application file for complete search history.

(56) References Cited

U.S. PATENT DOCUMENTS

| | | | |
|---|---|---|---|
| 10,666,273 B1* | 5/2020 | Sternberg | G01S 7/288 |
| 10,802,066 B1 | 10/2020 | Keaveney et al. | |
| 10,859,981 B1 | 12/2020 | Ramirez-Serrano et al. | |
| 10,979,147 B2 | 4/2021 | Gordon et al. | |
| 11,165,505 B2 | 11/2021 | Gordon | |
| 11,300,599 B1 | 4/2022 | Amarloo et al. | |
| 11,307,233 B1 | 4/2022 | Amarloo et al. | |
| 11,313,926 B1 | 4/2022 | Amarloo et al. | |
| 11,349,569 B2 | 5/2022 | Graceffo | |
| 11,435,386 B2 | 9/2022 | Holloway | |
| 11,585,841 B1 | 2/2023 | Jau | |
| 11,592,469 B2 | 2/2023 | Anderson | |
| 11,681,016 B1 | 6/2023 | Bohaichuk et al. | |
| 2015/0185256 A1 | 7/2015 | Funinoki | |
| 2015/0241217 A1 | 8/2015 | Bulatowicz et al. | |
| 2016/0169989 A1 | 6/2016 | Suzuki et al. | |
| 2016/0363617 A1 | 12/2016 | Anderson et al. | |
| 2018/0031620 A1 | 2/2018 | Anderson et al. | |
| 2019/0041434 A1* | 2/2019 | Moreno | G01R 19/2513 |
| 2019/0187198 A1* | 6/2019 | Anderson | G01R 29/0878 |
| 2020/0103456 A1* | 4/2020 | Terayama | G01L 9/0016 |
| 2020/0136727 A1 | 4/2020 | Graceffo | |
| 2020/0209288 A1* | 7/2020 | Karin | G01R 31/1272 |
| 2020/0292606 A1 | 9/2020 | Holloway et al. | |
| 2020/0295838 A1 | 9/2020 | Gordon | |
| 2021/0250101 A1 | 8/2021 | Gordon | |
| 2022/0390496 A1 | 12/2022 | Aksyuk | |

OTHER PUBLICATIONS

Adams, et al., "Rydberg atom quantum technologies", J. Phys. B: At. Mol. Opt Phys. 53, Dec. 3, 2019, 14 pgs.
Anderson, et al., "An Atomic Receiver for AM and FM Radio Communication", IEEE Trans. on Antennas and Propagation, May 2021, 8 pgs.
Anderson, et al., "Rydberg Atoms for Radio-Frequency Communications and Sensing: Atomic Receivers for Pulsed RF Field and Phase Detection", IEEE A&E Systems Magazine 35, 48, Apr. 2020, 10 pgs.
Fan, et al., "Atom based RF electric field sensing", Journal of Physics B: Atomic, Molecular and Optical Physics, Sep. 9, 2015, 17 pgs.
Fan, et al., "Dispersive radio frequency electrometry using Rydberg atoms in a prism-shaped atomic vapor cell", J. Phys. B: At. Mol. Opt. Phys. 49, 2016, 8 pgs.
Fan, et al., "Effect of Vapor-Cell Geometry on Rydberg-Atom-Based Measurements of Radio-Frequency Electric Fields", Physical Review Applied 4, 044015, 2015, 7 pgs.
Fan, et al., "Subwavelength microwave electric-field imaging using Rydberg atoms inside atomic vapor cells", Optics Letters, vol. 39, No. 10, May 15, 2014, 4 pgs.
Fleischhauer, et al., "Electromagnetically induced transparency: Optics in coherent media", Rev. Mod. Phys. 77, 633, 2005, 42 pgs.
Gea-Banacloche, et al., "Electromagnetically induced transparency in ladder-type inhomogeneously broadeneded media: Theory and experiment", Phys.Rev.A, Jan. 1995, 9 pgs.

Holloway, et al., "A Multiple-Band Rydberg Atom-Based Receiver", IEEE Antennas and Propagation Magazine, Jun. 2021, 14 pgs.
Holloway, et al., "Atom-Based RF Electric Field Metrology: From Self-Calibrated Measurements to Subwavelength and Near-Field Imaging", IEEE Transactions on Electromagnetic Compatibility 59, 2, Apr. 2017, 12 pgs.
Holloway, et al., "Broadband Rydberg Atom-Based Electric-Field Probe for SI-Traceable, Self-Calibrated Measurements", IEEE Trans. on Antennas and Propagation, vol. 62, No. 12, Dec. 2014, 14 pgs.
Jiao, et al., "Atom-based receiver for amplitude-modulated baseband signals in high-frequency radio communication", App. Phys. Express 12, Nov. 20, 2019, 5 pgs.
Jing, et al., "Atomic superheterodyne receiver based on microwave-dressed Rydberg spectroscopy", Nature Physics, vol. 16, Sep. 2020, 11 pgs.
Keel, "Fundamentals of Pulse Compression Waveforms", Chapter 20, Principles of Modern Radar, SciTech Publishing, 2010, 62 pgs.
Kretschmer, et al., "Huffman-Coded Pulse Compression Waveforms", Naval Research Laboratory, May 23, 1985, 19 pgs.
Kumar, et al., "Atom-Based Sensing of Weak Radio Frequency Electric Fields Using Homodyne Readout", Scientific Reports 7:42981, Feb. 20, 2017, 10 pgs.
Kumar, et al., "Rydberg-atom based radio-frequency electrometry using frequency modulation spectroscopy in room temperature vapor cells", Optics Express, vol. 25, No. 8, Apr. 17, 2017, 13 pgs.
Meyer, et al., "Digital communication with Rydberg atoms and amplitude-modulated microwave fields", App. Phys. Lett. 112, May 25, 2018, 6 pgs.
Meyer, et al., "Waveguide-Coupled Rydberg Spectrum Analyzer from 0 to 20 GHz", Phys. Rev. App. 15, Jan. 25, 2021, 10 pgs.
Richards, et al., "Radar Waveforms", Chapter 4, Principles of Modern Radar, Scitech Publishing, 2010, 74 pgs.
Ripka, et al., "Application-driven Problems in Rydberg Atom Electrometry", SPIE2021, 2021, 10 pgs.
Sapiro, et al., "Time dependence of Rydberg EIT in pulsed optical and RF fields", J. Phys. B: Atomic, Molecular and Optical Physics, Apr. 3, 2020, 10 pgs.
Sedlacek, et al., "Atom-Based Vector Microwave Electrometry Using Ribidium Rydberg Atoms in a Vapor Cell", Physical Review Letters, Aug. 6, 2013, 5 pgs.
Sedlacek, et al., "Microwave electrometry with Rydberg atoms in a vapour cell using bright atomic resonances", Nature Physics 8, Nov. 2012, 6 pgs.
Shaffer, et al., "A read-out enhancement for microwave electric field sensing with Rydberg atoms", SPIE Photonics Europe, 2018, Strasbourg, France, 2018, 11 pgs.
Simons, et al., "A Rydberg atom-based mixer: Measuring the phase of a radio frequency wave", Appl. Phys. Lett. 114, Mar. 18, 2019, 5 pgs.
Simons, et al., "Rydberg atom-based sensors for radio-frequency electric field metrology, sensing, and communications", Measurement: Sensors 18, Sep. 22, 2021, 4 pgs.
Song, et al., "Rydberg-atom-based digital communication using a continuously tunable radio-frequency carrier", Optics Express 27, 8848, Mar. 18, 2019, 10 pgs.
Steck, "Cesium D Line Data", Los Alamos National Laboratory, rev. 1.6, Oct. 14, 2003, 29 pgs.
Yu, "Nano-Photonic Platform for Atom-Light Interaction", Ph.D. Dissertation, California Institute of Technology, 2017, 168 pgs.
WIPO, International Search Report and Written Opinion dated Mar. 6, 2023, in PCT/CA2022/051861, 8 pgs.

* cited by examiner

SENSING PULSES OF RADIO FREQUENCY FIELDS

CROSS-REFERENCE TO RELATED APPLICATIONS

This application claims priority to U.S. Prov. App. No. 63/293,450, which was filed on Dec. 23, 2021, and entitled, "Sensing Radar and Communication Pulses Using Vapor Cells." The disclosure of the priority application is hereby incorporated by reference in its entirety.

BACKGROUND

The following description relates to sensing pulses of radio frequency fields, such as by using a vapor cell.

Vapor cells contain a vapor in an enclosed volume. The vapor is used as a medium to interact with electromagnetic radiation received by the vapor cells. Beams of light, such as generated by lasers, may be directed through the vapor to probe and measure a response of the vapor to the received electromagnetic radiation. In this way, the vapor cells may serve as sensors of electromagnetic radiation.

DETAILED DESCRIPTION

Figure 1:
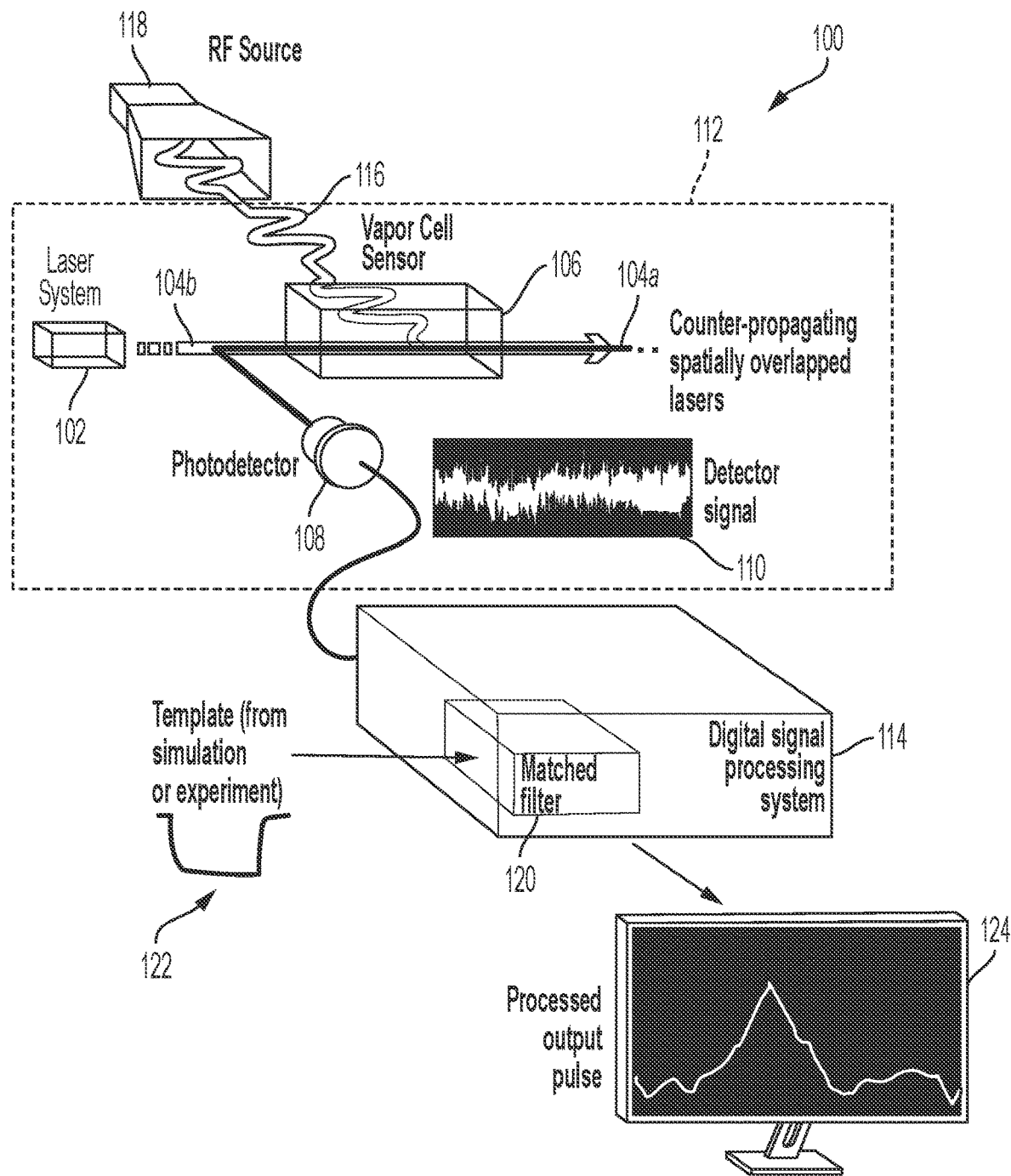
FIG. 1 is a schematic diagram illustrating an example system for sensing pulse-modulated RF electromagnetic radiation.

Rydberg atoms have shown significant promise as the basis for highly sensitive detectors of radio-frequency (RF) electric fields. For example, the time-dependent response of a cesium vapor to a pulse-modulated RF field at 19.4 GHz can be studied using a cesium vapor cell at room temperature. Moreover, density matrix simulations can be used to determine the time scales that shape the transient atomic response of a vapor of Rydberg atoms under different laser conditions. Such simulation may find them to be governed by, for instance, dephasing mechanisms, including transit time broadening, Rydberg-Rydberg collisions, and ionization. In some examples, a matched filter may be used to detect individual pulses (or sequences thereof) with durations from 10 us down to 50 ns and amplitudes from 1500 µV/cm down to −170 µV/cm. This detection can, in certain cases, occur with a sensitivity of less than 0.24 µV cm$^{-1}$ Hz$^{-1/2}$. Such sensitivity may allow Rydberg-atom vapor cells to serve as precision radar receivers. The Rydberg-atom vapor cell may, in some implementations, be a Rydberg photonic crystal vapor cell.

Technologies based on the unique features of quantum systems hold much attraction across broad applications in computing, communications, and sensing. Due to their uniformity, stability, and well-known properties, Rydberg atoms can form the basis for many of these applications. For Rydberg atoms based on alkali atoms, such as cesium (Cs) and rubidium (Rb), light can optically excite their outer electrons into a state that is extremely sensitive to the presence of other atoms, as well as external electric fields. There are many choices possible for these excited states, all accessed through laser and radio frequency excitation, which can allow for the significant tunability of Rydberg atom properties. Promising applications include radio-frequency (RF) electrometry, which can be based on the optical spectroscopy of Rydberg atoms contained in a vapor cell sensor.

In vapor cell sensors, the quantum interference between laser fields resonant with atomic or molecular transitions to excited Rydberg states can generate an optical transmission in what would otherwise be an absorbing vapor, termed electromagnetically induced transparency (EIT). The presence of an external RF field resonant with another atomic transition can disrupt this interference and cause the spectrally narrow EIT transmission peak to be split into two peaks by an Autler-Townes mechanism. (An example of such splitting is shown in FIG. 2B.) These peaks can be spaced further apart in optical frequency in proportion to the strength of the RF field. As a result, changes to the optical transmission of the vapor cell sensor can identify the presence and amplitude of RF fields with high accuracy and precision.

Atom-based electrometry can be advantageous in its ability to self-calibrate accurately and reproducibly to known atomic properties or constants. Such quantum sensors are capable of detecting electromagnetic fields across a broad MHz-THz frequency range with high sensitivity (e.g., a few nV cm$^{-1}$ Hz$^{-1/2}$ down to field amplitudes of about 1 nV/cm). The addition of a strong local auxiliary microwave field can further improve the sensitivity of the vapor-cell sensor to weak RF fields of about 55 nV cm$^{-1}$ Hz$^{-1/2}$. These sensors can provide a large frequency bandwidth of up to approximately 400 MHz around a single electronic transition, though the most sensitive sensing relies on the RF field being on or near-resonant to closely-spaced but discrete electronic level transitions. The broad bandwidth around a Rydberg resonance can provide quasi-continuous frequency coverage. Other methods also exist that can be used to obtain continuous RF coverage. Moreover, a tunable electric field can be added to dynamically Stark-shift levels. A heterodyne setup using an additional RF field can also be used. Small vapor cells (e.g., less than 30 mm$^3$) can be constructed purely from dielectric materials to allow for near-field measurements. In many cases, the dielectric vapor cells have sub-wavelength spatial resolution and minimally perturb the incident field, thereby providing opportunities for near-field imaging or the straightforward calibration of small antennas. Representative examples of such vapor cells, including photonic crystal vapor cells, are described further U.S. Pat. No. 10,859,981, entitled "Vapor Cells Having One or More Optical Windows Bonded to a Dielectric Body," and U.S. Pat. No. 11,209,473, entitled "Sensing Radio Frequency Electromagnetic Radiation."

While Rydberg electrometry can be used for sensing the amplitude of continuous wave RF fields, EIT dynamics have been found to occur at time scales well below sub-microsecond, including in response to RF fields. This behavior can, in some instances, allow for the detection of modulated RF field envelopes, including pulse-modulated, amplitude modulated (AM), and frequency modulated (RF) RF field envelopes. Furthermore, the behavior may allow for the detection of a polarization or phase of the RF field, which in certain cases, may also use an additional RF reference field.

In some implementations, a vapor cell sensor may be used that incorporates a cesium vapor. This cesium-based vapor cell sensor can be used at room temperature with counter-propagating green and infrared (IR) lasers to detect changes in transmission in response to pulsed RF fields. However, other implementations are possible, e.g., a rubidium photonic crystal vapor cell, the use of more than two lasers, or the use of other laser frequencies corresponding to a different set of atomic transitions. Using density matrix theory, time scales may be studied that dictate the atomic response time, including the effects of transit time broadening, collisions, and ionization. As described herein, the signal-to-noise ratio (SNR) and timing precision of single pulses can be improved by applying a matched filter (e.g., through an FPGA, through a microprocessor, or through another type of device). Moreover, RF fields may be detected down to less than 170 µV/cm, corresponding to a sensitivity of less than 240 nV cm$^{-1}$ Hz$^{-1/2}$. This detection performance does not need an auxiliary RF field. The vapor cell sensor may be used as a radar receiver. It can, for example, be used to detect 1 us pulses emitted by a rotating emitter, such as on a passing aircraft.

To sense pulsed RF fields (e.g., amplitude-modulated RF fields), a vapor cell sensor may be filled with a vapor that includes atoms such as cesium or rubidium atoms, and for convenience, operated at or near room-temperature. The vapor cell sensor may be formed in whole or in part of a dielectric material. Two or more laser beams resonant with respective electronic transitions of the atoms are used to generate EIT using Rydberg states. The laser beams, which may be generated by a laser system, can include a two-photon counter-propagating scheme or a 3-photon system. The laser (or lasers) of the laser system may be frequency locked onto the electronic transitions. Such locking can be achieved, for example, with the Pound-Drever-Hall technique using a reference cell and an external Fabry-Perot cavity. However, other techniques are possible.

FIG. 1 presents a schematic diagram showing an example system 100 for sensing pulses of radio frequency (RF) fields. The example system 100 includes a laser system 102 that is configured to generate beams of light 104 (e.g., laser beams). To do so, the laser system 102 may include one or more individual lasers to generate the beams of light 104. For example, the one or more individual lasers could include gas lasers, solid-state lasers (e.g., diode lasers), fiber lasers, liquid lasers, and so forth. The laser system 102 may include one or more optical elements for manipulating the beams of light 104, such as mirrors, lenses, fiber optic cables, polarizers, optical filters, frequency multipliers, and so forth.

The beams of light include a probe beam of light 104a, and in many variations, also include a coupling beam of light 104b. The beams of light 104 may be distinct from each other in frequency (or wavelength), polarization, phase, direction, position, and so forth. FIG. 1 illustrates the case where the beams of light 104 include the probe beam of light 104a and the coupling beam of light 104b that differ at least in frequency. In this case, a two-photon scheme may be used by the example system 100 for sensing, for example, pulse-modulated RF electromagnetic radiation. An example of a two-photon scheme is described in relation to FIG. 2A. However, in other variations, the beams of light 104 may include a third beam of light and the example system 100 may operate using a three-photon scheme. Other multi-photon schemes are possible.

The example system 100 also includes a vapor cell sensor 106 having a vapor therein (e.g., an atomic or molecular vapor) and configured to allow the beams of light 104 to pass through the vapor. The vapor may include constituents such as a vapor of alkali-metal atoms, a noble gas, a gas of diatomic halogen molecules, or a gas of organic molecules. For example, the vapor may include a vapor of Group IA atoms (e.g., K, Rb, Cs, etc.), a noble gas (e.g., He, Ne, Ar, Kr, etc.), or both. The beams of light 104 may pass through the vapor along an optical pathway. For example, the probe beam of light 104a and the coupling beam of light 104b may pass through the vapor by propagating along the optical pathway in opposite directions (e.g., counter-propagating), such as shown in FIG. 1. However, other configurations are possible. For example, the probe beam of light 104a and the coupling beam of light 104b may pass through the vapor and reflect off an internal mirror (e.g., a dielectric mirror) of the vapor cell sensor 106. In this configuration, the probe beam of light 104a and the coupling beam of light 104b may co-propagate together along the optical pathway in the same direction.

The example system 100 additionally includes an optical detector 108 that is configured to generate a detector signal 110 based on the probe beam of light 104a after the probe beam 104a has passed through the vapor. For example, the optical detector 108 may be a photodetector that generates an electrical signal in response to receiving a beam of light (e.g., the probe beam of light 104a). In some variations, the detector signal 110 may be based on an amplitude of the probe beam of light 104a, a polarization of the probe beam of light 104a, a phase of the probe beam of light 104a, or any combination thereof. In some variations, the optical detector 108 receives only the probe beam of light 104a and the coupling beam of light 104b is discarded (e.g., absorbed by an optical stop). However, in other variations, more than one beam of light 104 may be used by the example system 100. In these variations, the example system 100 may include an instance of the optical detector 108 for each beam of light 104 used. In some variations, such as shown in FIG. 1, the vapor cell sensor 106 and one or both of the laser system 102 and the optical detector 108 are part (or all) of a vapor cell sensor system 112.

The example system 100 also includes a signal processing system 114 that is configured to perform operations in response to receiving the detector signal 110. The signal processing system 114 may, for example, include a processor that is based on a field programmable gate array (FPGA). However, other types of processors are possible. For example, the processor may be based on an application specific integrated circuit (ASIC) or a general processor (e.g., an x86 processor or an ARM processor). The signal processing system 114 may also include one or more memories that are configured to store instructions representing the operations. The one or more memories may also be configured to store data produced by executing the operations. In many variations, the one or more memories are in communication with the processor. In some variations, the signal processing system 114 includes a high pass filter configured to block a portion of the detector signal 110 that is below a threshold frequency (e.g., a portion less than or equal to 100 Hz). The threshold frequency can be 100 Hz or another frequency that will block a DC-offset signal and possibly other unwanted low-frequency components. The high pass filter may, for example, allow the signal processing system 114 to exclude undesired artefacts that can arise in measurements made by the vapor cell sensor 106, the optical detector 108, or both.

The operations of the signal processing system 114 include receiving the detector signal 110 from the optical detector 108 over a time period and generating a digital signal based on the detector signal 110. The digital signal represents a measured response of the vapor to an RF field 116 experienced by the vapor over the time period. In some variations, the detector signal 110 is converted into the digital signal by operation of an analog-to-digital converter (ADC). In certain cases, an amplifier may be electrically coupled to the ADC (e.g., electrically upstream) to spread an electrical signal received by the ADC across a dynamic range of the ADC. However, other types of analog components may also process the electrical signal (e.g., an analog filter) before the electrical signal is received by the ADC.

The RF field 116 may be produced by an RF source 118. Examples of the RF source 118 include an RF horn antenna, a dipole antenna, a source configured to produce RF pulses, RF signals reflected off a moving object (e.g., radar signals), and so forth. FIG. 1 depicts the RF source 118 as an RF horn antenna capable of generating RF test signals. However, other sources of the RF field 116 are possible. The operations also include applying a matched filter 120 to the digital signal to generate a filtered signal. In some cases, parameters of the matched filter 120 may be stored as data in the one or more memories of the signal processing system 114. Moreover, the matched filter 120 may be applied by the processor to the digital signal when the processor executes the instructions stored in the one or more memories.

The filtered signal is generated based on a comparison of the digital signal with a response template 122. The response template 122 represents a known response of the vapor to a target RF pulse. In some variations, the response template 122 is based on a computer simulation of a response of the vapor to the target RF pulse. In some variations, the response template 122 is based on empirical data acquired or processed by the example system 100. For instance, the example system 100 may include a source 118 of the RF field 116 that is configured to produce RF pulses. In these instances, the response template 122 may be based on a plurality of reference RF pulses generated by the source 118 over a reference time period. The plurality of reference RF pulses define the RF field 116 and share a common pulse shape. In some variations, the plurality of reference RF pulses may include subsets of reference RF pulses, each sharing a different, respective common pulse shape.

The operations of the signal processing system 114 additionally include processing the filtered signal to determine properties of the RF field 116 experienced by the vapor over the time period. Such processing may include determining at least one of a start time, a duration, or an amplitude of an RF pulse experienced by the vapor in the time period. Multiple RF pulses are possible (e.g., a sequence of RF pulses), including multiple types of RF pulses. For example, the response template 122 may be a first response template that represents a first known response of the vapor to a first type of target RF pulse. In this case, the filtered signal may be generated based on a comparison of the digital signal with the first response template and a second response template that represents a second known response of the vapor to a second type of target RF pulse. The first and second types of target RF pulses may, for example, have different, non-overlapping ranges of field strength (e.g., a first range of field strength that is entirely outside of a second range of field strength). However, other differences are possible (e.g., duration, phase, etc.).

In some implementations, such as shown in FIG. 1, the signal processing system 114 may be in communication with a computer 124 of the example system 100. In these implementations, the computer 124 may include a display device (e.g., a flat panel display) and allow an operator of the example system 100 to interact with components of the example system 100 (e.g., the signal processing system 114). For example, the computer 124 may allow the operator to observe the properties of the RF field 116 determined by the signal processing system 114.

In some implementations, the example system 100 includes a heterodyne RF source configured to produce a heterodyne RF field having a frequency that is known, but different than that of the RF field 116. The heterodyne RF field may, for example, include a continuous wave (CW) RF field. The heterodyne RF source is oriented towards the vapor cell sensor 106, and during operation of the example system 100, may be energized at the same time as the RF source 118 to allow the heterodyne RF field and the RF field 116 to simultaneously interact with the vapor. During such interaction, the two fields may interfere with each other, such as by constructive interference or destructive interference. However, because the frequency of the heterodyne RF field is known, this interference can be used in certain cases to improve the ability of the signal processing system 114 to determine properties of the RF field 116.

In operation, the example system 100 uses the laser system 102 to generate the beams of light 104, which then pass through the vapor in the vapor cell sensor 106. During such passage, the RF field 116 may interact with the vapor, thereby altering an optical transmission of the vapor, such as through an EIT mechanism. This interaction may occur during all or part of the time period. The latter case may correspond to the RF field 116 not being present during part of the time period. The optical detector 108 receives at least the probe beam of light 104a after passing through the vapor, and in response, generates the detector signal 110. The signal processing system 114 receives the detector signal 110 over the time period and generates the digital signal based on the detector signal 110. The digital signal represents the response of the vapor—as measured by the optical detector 108 via the beams of light 104—to the RF field 116 over the time period. As such, the response of the vapor corresponds to a measured response of the vapor. In this example, the measured response is obtained using the probe beam of light 104a. However, other beams of light may be used (e.g., in place of or in addition to the probe beam of light 104a).

The signal processing system 114 then applies the matched filter 120 to the digital signal to generate the filtered signal. In doing so, the signal processing system 114 may compare the digital signal to the response template 122, which represents a known response of the vapor to a target RF pulse. The signal processing system 114 may also apply the matched filter 120 by applying a convolution function to the digital signal and response template 122 to generate the filtered signal. A period of the response template for the convolution function may be greater than an expected duration of a pulse of the RF field 116. Examples of the convolution function are described further below in relation to Equation (4). The filtered signal is subsequently processed by the signal processing system 114 to determine properties of the RF field 116 experienced by the vapor over the time period. In some circumstances, the example system 100 may operate for a length of time without detecting an RF field or an RF pulse. In these circumstances, the RF field 116 may not be present or may be too weak to be detected by the example system 100. In some variations, the example system 100 may use the heterodyne RF source to generate a heterodyne RF field that includes a continuous wave (CW) RF field over the time period. The heterodyne RF field interacts with the vapor and may do so at the same time as the RF field 116.

The signal processing system 114 may process the filtered signal to determine at least one of a start time, a duration, or an amplitude of an RF pulse experienced by the vapor in the time period. However, other properties of the RF pulse are possible (e.g., frequency, polarization, etc.). For example, Doppler shifts can be detected using the frequency of a repetition rate of the RF pulse. One technique that can be used is pulse Doppler processing. With this technique, range data from returning pulses is binned. The pulses in a specific bin, consisting of multiple pulses, is then analyzed. The Doppler shift resolution for this method is +/−PRF, where the PRF refers to the pulse repetition rate. The RF pulses in a specific bin can be Fourier transformed by the signal processing system 114 into the frequency domain to determine the Doppler shift.

Likewise, the matched filter is useful for polarization as two different crossed polarized receivers can be used to determine polarization. Time correlations between the received pulses can also be used to decrease noise.

In a general aspect, EIT is sensitive to the presence and strength of incident RF fields and resulting transient changes to the transmission of one of the laser beams through the vapor cell sensor are read out optically with a high-bandwidth photodetector. The photodetector signal is input into a digital processing system, for example on an FPGA, which applies a matched filter to the data. A DC block may also be added after the photodetector but before the FPGA. In these cases, the DC block includes a high pass filter with a low enough cutoff frequency, below a few kHz, to avoid distorting the measured pulse shape. Such blocking may remove any DC offset in the optical response of the photodetector and therefore in the matched filter output, which can ease subsequent processing such as thresholding or amplification.

A template, e.g., a "known pulse shape", for the filter to match to can be obtained either through density matrix modeling of the atomic response of the vapor, or through an experimental measurement taken at the same laser conditions used for sensing. The experimental measurements can be averaged over many cycles to reduce noise. An atomic response for the template can be used rather than an experimental outgoing RF pulse because, although the pulse shape approximates the envelope of the RF pulse, it can differ due to the finite atomic response time. The matched filter can be implemented as the convolution process of a finite impulse response filter, with the template data points used as coefficients. The template data can be discretized to have a sampling rate matching the incoming photodetector data, after any down sampling that may be done to reduce processor resources. Using a longer pulse (or one with a higher sampling rate) can utilize a larger portion of the processor due to the higher number of template datapoints and therefore multiplication and addition steps required. The matched filter outputs a peak when an RF pulse is detected, with the timing of its maximum identified as the time of best match between the pulse template and the experimental pulse, which corresponds to the end time of the pulse. The maximum can be identified in digital post-processing such as through a peak-finding algorithm, or in real-time using techniques such as thresholding or constant-fraction discrimination.

The incident RF field can have a frequency on or near resonance to another electronic transition for best sensitivity, with the transition being between two levels where one of the levels matches the uppermost atomic energy level coupled to by the lasers. The vapor cell sensor can be operated independently without any gain or filtering applied to the incident RF field prior to sensing by the vapor cell, but can be implemented in a system with a receiving antenna or dish to amplify the incoming RF field entering the cell. An example of such a system is described below in relation to FIG. 6A. In some cases, the vapor cell sensor could be based on a photonic crystal vapor cell. Examples of the photonic crystal vapor cell, including its operation, are described further U.S. Pat. No. 11,137,432, entitled "Photonic Crystal Receivers."

In some implementations, a 3-cm long rectangular glass-blown cell can be filled with cesium vapor at room temperature. EIT in the vapor cell is generated using counter-propagating laser beams in which the probe laser beam has an IR wavelength of 852.35 nm and the coupling laser beam has a green wavelength of 509.31 nm. The probe and coupling laser beams have radii of, respectively, about 160 µm and 140 µm 1/e². These wavelengths are resonant with transitions between atomic states in the ladder system shown in FIG. 2A. In all measurements, the IR laser beam is offset locked on resonance with the Cs F=4 to F'=5 D2 transition using an external Fabry-Perot cavity and a Pound-Drever-Hall technique. Transmission of the IR laser through the vapor cell is detected using an avalanche photodetector having a bandwidth of 10 MHz. The detector signal from the photodetector is then input into a Red Pitaya FPGA for further processing using a matched filter.

For testing, RF pulses can be applied using pulse modulation on an RF synthesizer, with rise and fall times of less than 100 ns, output to an RF horn antenna with a gain of 15 dB placed about 25 cm from the vapor cell. The output of the RF horn has a frequency of 19.4 GHz (K-band), which couples the $55D_{5/2}$ and $53F_{7/2}$ Rydberg states of Cs shown in FIG. 2A, with a pulse repetition rate of 5 kHz.

Figure 2A:
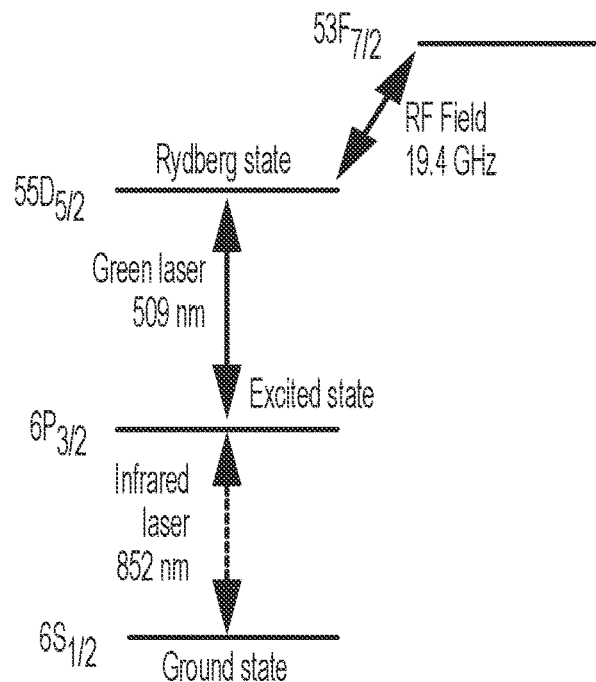
FIG. 2A is a schematic diagram of an example energy level diagram for a cesium-based vapor cell.
Figure 2B:
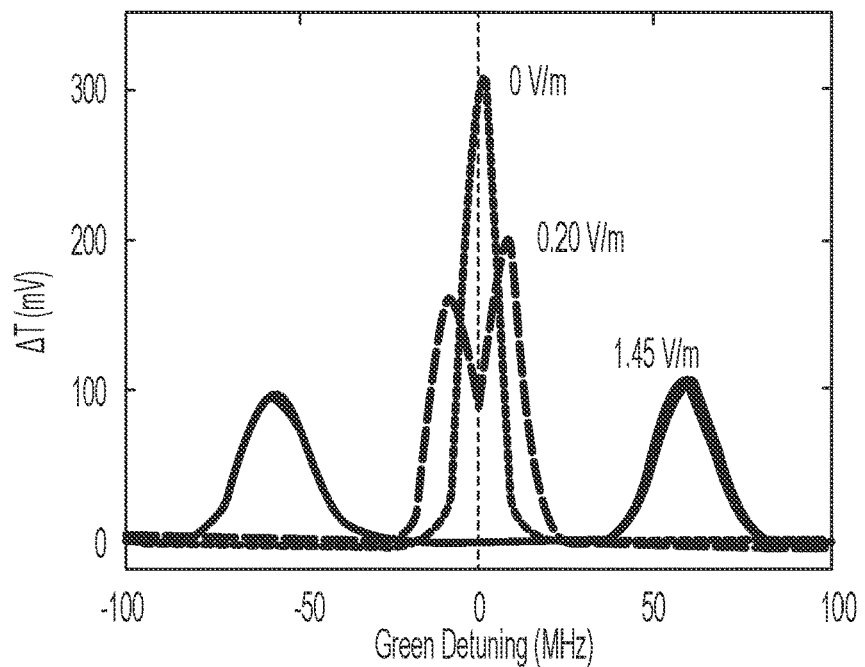
FIG. 2B is a graph of the EIT peak obtained from the cesium-based vapor cell of FIG. 2A as a 509-nm laser is scanned across resonance.
Figure 2C:
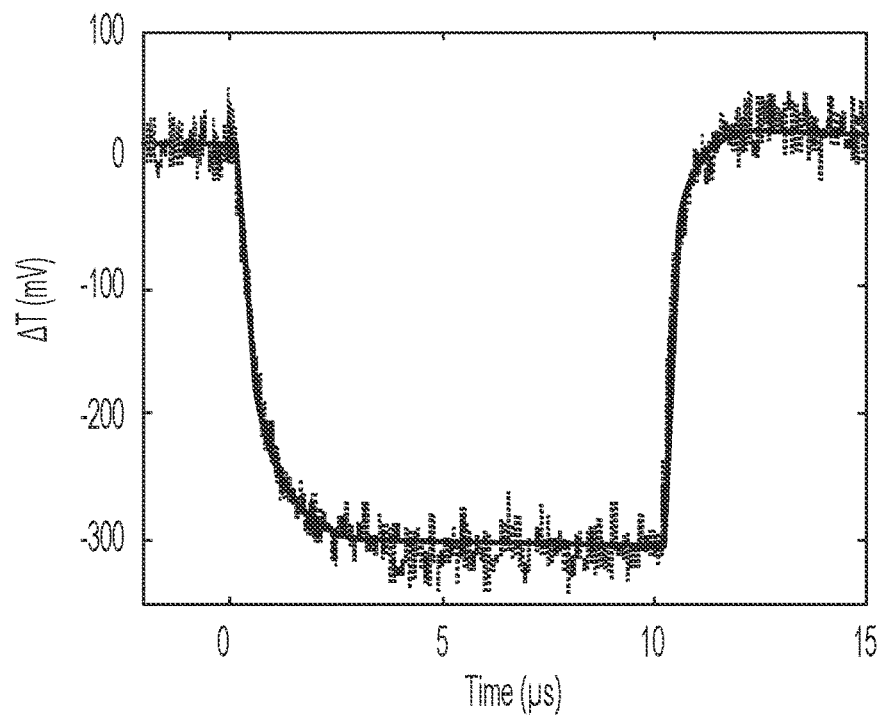
FIG. 2C is a graph of the transient atomic response of the cesium-based vapor cell of FIG. 2A to a RF pulse.

Now referring to FIG. 2A, a schematic diagram is presented of an example reduced energy level diagram for a cesium-based vapor cell. FIG. 2B presents a graph of the EIT peak obtained by the cesium-based vapor cell using the system of atom-field interactions shown in FIG. 2A as a 509 nm laser is scanned across resonance. Autler-Townes splitting of the peak is shown for two different continuous wave RF fields. To measure RF pulses, the green laser is locked on resonance (dashed line). FIG. 2C presents a graph of the transient atomic response of the cesium-based vapor cell whose atom-field interactions are illustrated in FIG. 2A to a 10 µs RF pulse, measured as a change in transmission on the 852 nm laser, with both a single trace (dashed lined) and one averaged over $10^4$ cycles (solid line) for an RF field of 1.45 V/m, corresponding to $\Omega_{RF}=2\pi\times117$ MHz. $\Omega_p=2\pi\times3.5$ MHz, $\Omega_c=2\pi\times8.4$ MHz.

FIG. 2B shows EIT measured from the vapor cell with no RF field applied (line labeled 0 V/m) as the green laser is scanned over resonance. The full-width at half-maximum (FWHM) of the EIT peak at these laser conditions is about 4.5 MHz, and increases with $\Omega_p$ or $\Omega_c$. Upon application of a continuous wave RF field, Autler-Townes splitting of the EIT peak is observed, shown for two field strengths of 0.20 V/m and 1.45 V/m in FIG. 2B. The slight asymmetry in peak height arises from a background DC electric field present in the vapor cell. The peak splitting is given by $v=E\,\mu_{21}/h$, where $\mu21=6294.3ea_0$ and is the dipole moment of the $55D_{5/2} \leftrightarrow 53F_{7/2}$ transition; h is Planck's constant; and E is the amplitude of the RF field. The splitting of the EIT peaks is measured in response to continuous wave RF fields of various strengths to extract a calibration factor for converting the nominal output field of the RF generator to a field received at the vapor cell. The difference between the two fields can arise primarily from cable losses and antenna gain. At low RF intensities, when the peak splitting is not discernable (e.g., less than 0.1 V/m), this calibration factor may be used to extrapolate the RF field/pulse detected by the atoms in the vapor cell.

To detect an RF pulse, the green laser can be locked on resonance to the center of the EIT peak, at the location marked with a vertical dashed line in FIG. 2B. Upon application of an RF pulse the EIT peak splits, transmission at the resonance point experiences a large drop, which is detected as a pulse shown in FIG. 2C. At lower RF fields, the splitting is reduced and peak overlap increases, resulting in a lower change in transmission and therefore a lower pulse depth in the detected optical transmission. The atomic response shape approximates an inversion of the RF pulse envelope but has slower leading and trailing edges. These edges can each take approximately 2 us to reach steady state after an initial rapid less-than 100 ns transient. A sufficiently averaged pulse, with minimal noise, such as the smooth line shown in FIG. 2C, can form the basis for the matched filter template.

Alternatively, a simulated atomic response (or model of the response) can be used as the template input to the matched filter. This approach can provide a rapid means for changing the laser conditions used without requiring an RF test setup to acquire an experimental pulse. An example model of the vapor and its response, which can occur as a pulse in EIT, may be represented by, for example, a 5-level atomic system. To model this pulse, as well as to better understand the origins of the atomic time scales, a density matrix simulation of a 5-level system can be performed, which follows the time-dependent master equation shown in Equation (1):

$$\dot{\rho} = \frac{i}{\hbar}[\rho, H] + \mathcal{L}(\rho), \qquad (1)$$

where H is the Hamiltonian of the system, p is the density matrix, $\mathcal{L}$ is the Lindblad operator, and h is the reduced Planck's constant. The first four levels in the model system correspond to those shown in FIG. 2A, with |1⟩ referring to the ground state, |2⟩ to the intermediate excited state, |3⟩ to the Rydberg excited state, and |4⟩ to the excited state coupled to by the RF field. We add a fifth level |5⟩ as a dark state representing atomic states that are populated through Rydberg-Rydberg collisions, radiative decay, and blackbody radiation and ionization, but which are not optically coupled to the primary system. This level helps to better model the pulse time scales, especially on a trailing edge of the pulse. The Hamiltonian of this system in the interaction picture may be represented by the following matrix equation:

$$H = \hbar \begin{pmatrix} 0 & \frac{\Omega_p}{2} & 0 & 0 & 0 \\ \frac{\Omega_p}{2} & -\Delta_2 & \frac{\Omega_c}{2} & 0 & 0 \\ 0 & \frac{\Omega_c}{2} & -\Delta_3 & \frac{\Omega_{RF}(t)}{2} & 0 \\ 0 & 0 & \frac{\Omega_{RF}(t)}{2} & -\Delta_4 & 0 \\ 0 & 0 & 0 & 0 & 0 \end{pmatrix}. \qquad (2)$$

In Equation (2), $\Omega_p$, $\Omega_c$, and $\Omega_{RF}(t)$ are the Rabi frequencies of the probe laser, the coupling laser, and the RF field respectively. The RF field is initially off ($\Omega_{RF}=0$) for a time period so that the simulation can reach equilibrium, then the RF field is turned on for the pulse duration, which can include a finite rise and fall time. The detuning of the |2⟩ state is given by $\Delta_2=-\Delta_p+k_pv$ and the detuning of the |3⟩ state by $\Delta_3=-\Delta_p-\Delta_c+(k_p-k_c)v$, with both probe and coupling lasers locked on resonance so $\Delta_4=\Delta_c=0$. $k_p$ and $k_c$ are the wavevectors of the probe and coupling lasers, respectively, while v is the atom velocity along the direction of the probe laser that is used to account for Doppler shifts.

The Lindblad operator $\mathcal{L}$ can account for the decay and the dephasing of the atomic states. $\Gamma_{21}=2\pi\times5.2$ MHz may be used as a well-known decay rate from $6P_{3/2}$ to $6S_{1/2}$, and $\Gamma_{32}$ as a radiative decay rate for the Rydberg state to the excited state. In the example model, the rates $\Gamma_{31}=\Gamma_{41}=\Gamma_{51}$ are fitted to experiment and represent a transit time through the beams, with atoms in the |3⟩, |4⟩, and |5⟩ states being replaced by ground state |1⟩ atoms once they drift out of the beam. Finally, $\Gamma_{35}$ represents a generation rate for atoms and/or ions in the dark state, arising primarily through Rydberg-Rydberg collisions. This rate can be implemented as a fixed average value or a time-varying rate that depends on the Rydberg state population. Decay from state |4⟩ can also be explicitly included but its values are small for the example case, so in the example model, the decay and dephasing from level |4> are ignored.

Figure 3A:
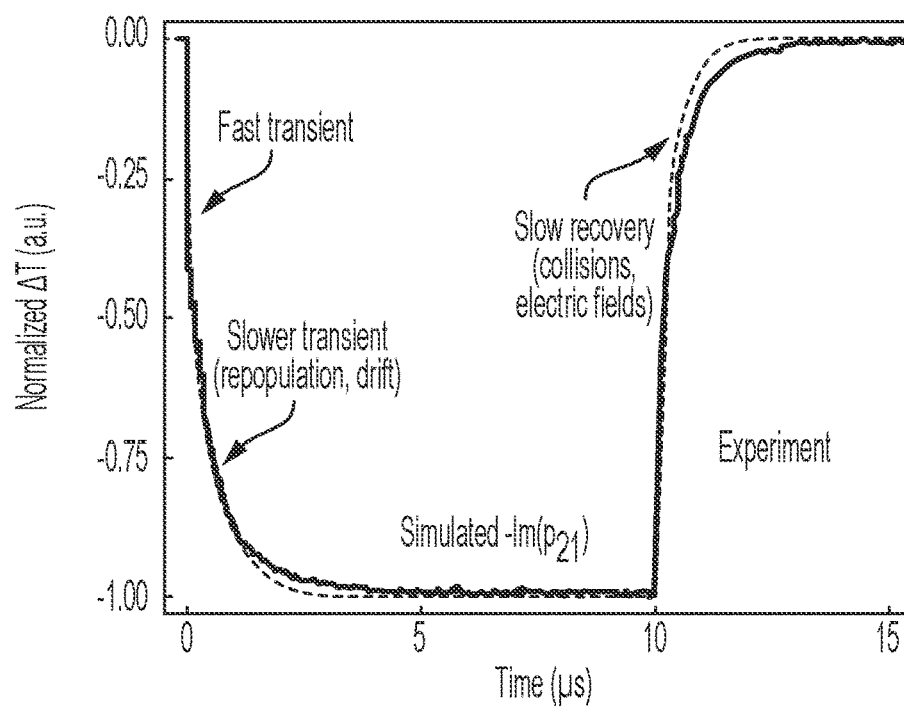
FIG. 3A is a graph of an experimental atomic response to a RF pulse compared to one simulated with a density matrix model.
Figure 3B:
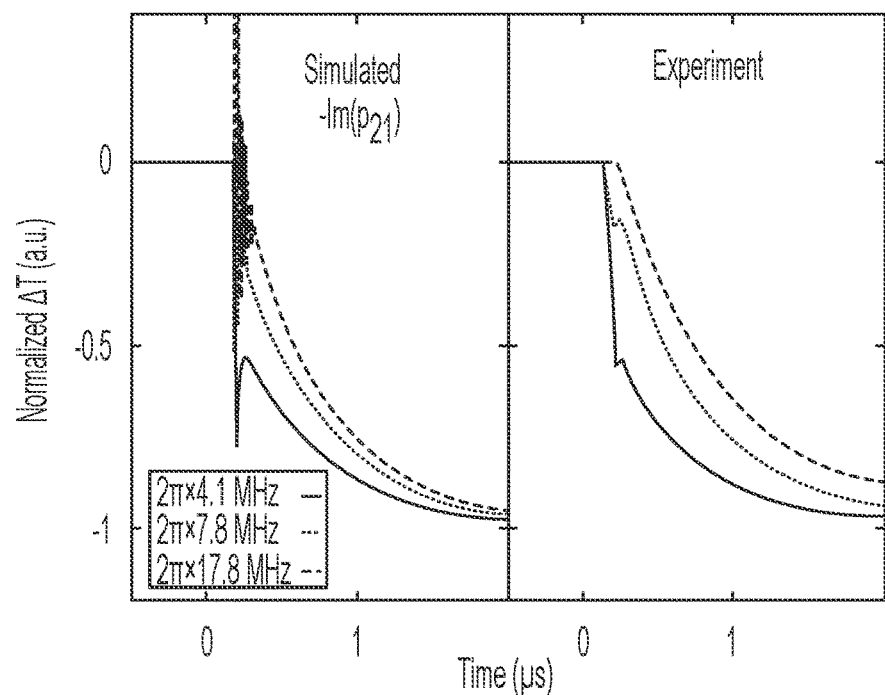
FIG. 3B is a graph showing changes to the leading edge of the pulse response of FIG. 3A with the IR power, shown by both modeling (left panel) and experiment (right panel)

Now referring to FIG. 3A, a graph is presented of an experimental atomic response (an example of a measured response of the vapor) to a 10-µs RF pulse compared to one simulated with a density matrix model. The former is represented in FIG. 3A by a solid line and the latter by a dashed line. Such a model can capture the overall shape of the pulse well, except for slow electric field effects predominant at the end of the pulse, and can be used as a matched filter template. For the example case shown by FIG. 3A, $\Omega_p=2\pi\times1.8$ MHz, $\Omega_c=2\pi\times8.4$ MHz, $\Omega_{MW}=2\pi\times119$ MHz. FIG. 3B presents a graph showing changes to the leading edge of the pulse response of FIG. 3A with the IR power, shown by both modeling (left panel) and experiment (right panel). Here, $\Omega_c=2\pi\times8.4$ MHz and $\Omega_{MW}=2\pi\times119$ MHz.

An example simulated atomic response template to a 10-µs RF pulse is shown in FIG. 3A along with experimental results for comparison. The change in the imaginary part of the density matrix element, $p_{21}$, is proportional to the absorption coefficient $\alpha$. This change closely approximates the total change in transmitted intensity of the probe laser after passing through the vapor cell under weak absorption conditions. An absolute value for total absorption can be difficult to model due to uncertainties in the atom number density, optical losses (including reflections and absorption due to the vapor cell walls and downstream optical components), detector sensitivity, and detector gain. A Doppler averaged value of $p_{21}$ may be obtained by integrating simulations performed at different velocities, v, over the Boltzmann distribution, such as shown by Equation (3):

$$\rho_{21} = \int \frac{m}{2\pi k_B T} \exp\left(-\frac{mv^2}{2k_B T}\right) \rho_{21}(v) dv \quad (3)$$

Here, T is the vapor cell temperature, m the atomic mass of the alkali atom used (here $133_{Cs}$), and $k_B$ is Boltzmann's constant.

The leading edge of the pulse may include two time scales. For example, an initial time scale may include a sharp decrease in transmission occurring over approximated 50 ns, and a subsequent time scale may include a slower exponential reduction in transmission over a few microseconds. The initial sharp transient is driven by sudden absorption of the probe laser in response to the EIT being effectively altered by the RF field, and is visible at low optical Rabi frequencies (e.g., low laser powers). Here, the two level system on the D2 transition drives itself to equilibrium based on the populations in the $6P_{3/2}$ and $6S_{1/2}$ states and the coherences at the time when the EIT was shifted. The calculated transient spike may not be fully observed experimentally due to limited detection bandwidth. The relative presence and depth of this fast transient diminishes as $\Omega_p$ increases, in both model and experiment, as shown in the left and right panels of FIG. 2B respectively. Therefore, if a rapid detection of the arrival of an RF pulse is desired, or on the detection of short sub-microsecond RF pulses, it may be advantageous to use lower $\Omega_p$ conditions where the sharp deep transient is present.

Slower subsequent dynamics can be accounted for by considering the repopulation of the interaction region in the vapor cell due to atomic motion, which is set by the transit time of atoms through a laser beam and the population of the dark state |5⟩). Prior to the RF pulse, a fraction of the atoms can end up in a dark state due to collisions, radiative decay, and black-body processes, and may be unable to participate in the optical dynamics on the D2 transition. Once the RF field is turned on, however, the Rydberg state is shifted off-resonance due to the Autler-Townes effect and the atomic system sees the green laser as effectively turned off, preventing the creation of more Rydberg states |3⟩) and their associated collisional byproducts. The dark state atoms eventually drift out of the laser beams and are replaced by fresh ground state atoms, at a rate depending on the transit time. An exponential fit to the portion of the pulse after the initial transient can yield an effective time constant that scales linearly when the laser beam diameter is increased and therefore the transit time (see FIGS. 7A and 7B).

The recovery time at the trailing edge of the pulse can be considerably longer than the dynamics at the leading edge of the pulse, and at higher laser powers the pulse often displays a period of enhanced transmission. This behavior may be attributed in part to collisional-dependent ionization and electric field effects in the vapor cell, which can take considerably longer to re-equilibrate (e.g., on the order of 100 µs) after changes to the ionization rate occur during the pulse. As a result, the pulse shape may depend slightly on the pulse rate. These effects are shown in FIGS. 8-12F and are stronger with increased $\Omega_c$. Combined with the strong dependence on the amount and direction of green laser detuning $\Delta_c$, the effects suggest a collisional origin. Furthermore, the precise form of the long transient tail may depend on the position of the laser beams as they pass through the vapor cell, suggesting any background electric field in the vapor cell can be influential. One way of approximately modeling this slow response is by using a high $\Gamma_{35}$ rate, especially one that depends on the Rydberg population. However, given that these effects are dependent on the particular vapor cell and can be non-trivial to model accurately, better performance of the matched filter is obtained by using an experimental template.

Figure 4A:
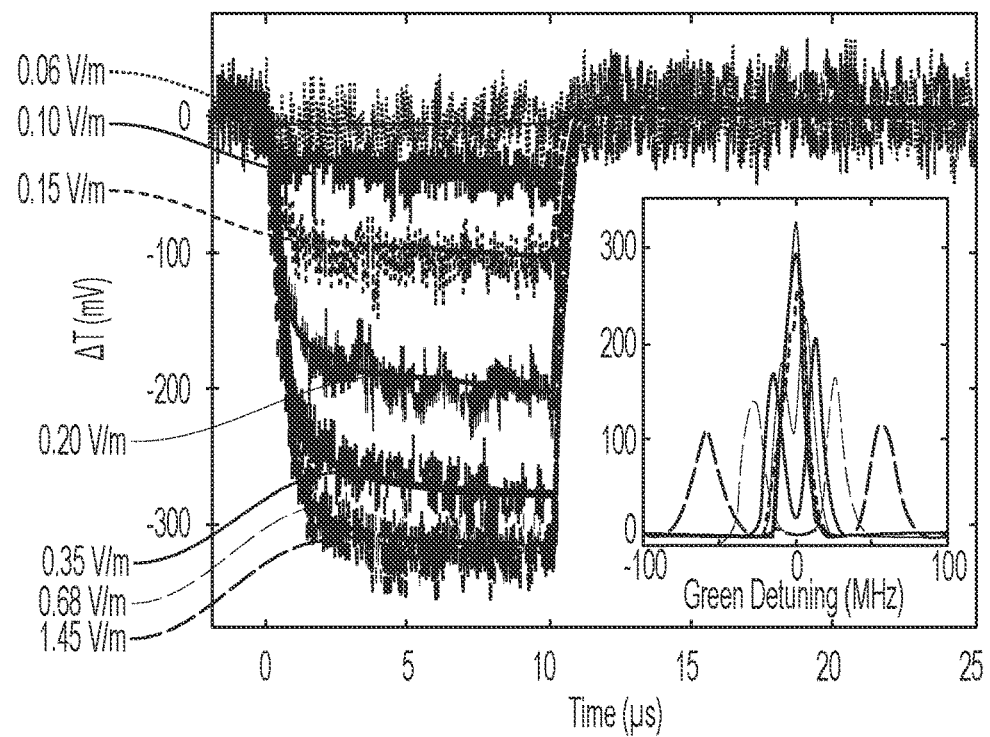
FIG. 4A is a graph of an example atomic response to a RF pulse of varying electric field amplitude.

In some implementations, the example system 100 may be configured to detect single RF pulses or a sequence of RF pulses, such as those aimed at communication and radar receiver applications. FIG. 4A shows the atomic response of the example system 100 to 19.4 GHz pulses of different amplitudes, with the corresponding EIT peak splitting in response to a continuous RF field, as shown in the inset. The primary change may be solely in the depth of the pulse, as a lower RF amplitude leads to lower EIT peak splitting, with only a slight change to the second slower time constant of the leading edge. Such behavior is described further in relation to FIGS. 7A-12F. Any changes to unevenness in the bottom of the pulse around 3 us may be picked up from minor amplitude variations in the RF output itself.

To improve the detection of weak RF pulses, and to improve the signal-to-noise ratio (SNR), a matched filter may be applied to individual pulses. In certain cases, this technique may be used to extract a known pulse shape from white noise. Mathematically, the matched filter may be represented by a convolution of the noisy waveform, $P_{data}$(t), with a time-reversed expected pulse template, $p_{temp}(t)$.

The convolution may be represented by a convolution function, MF(t), as shown below by Equation (4):

$$MF(t) = \int_{-\infty}^{\infty} p_{data}(s) P_{temp}(s + t_{pulse} - t) ds. \quad (4)$$

In some instances, Equation (4) is discretized to use on an FPGA. The filter output's peak corresponds to the point of maximum cross-correlation of an expected pulse shape with a measured noisy waveform. The peak may therefore allow the FPGA to identify the pulse arrival time, $t_{arrival}$, plus the pulse template length, $t_{pulse}$. In some variations, the pulse template length, $t_{pulse}$, serves as a period of the response template for the convolution function. The point of maximum cross-correlation may allow properties of an RF pulse to be determined from the measured noisy waveform, such as by reference to the expected pulse template. Such properties include a start time of the RF pulse, an end time of the RF pulse, a duration of the RF pulse, an amplitude of the RF pulse, and so forth.

The optical transmission is not immediately restored to its pre-pulse value when the RF field is turned off, as demonstrated in FIGS. 2C and 4A, but rather the atoms respond with a finite timescale of a few microseconds. Thus, in some implementations of the response template, a 0.5-2 us period is added beyond the RF pulse's end to match the full atomic response shape. As a result, $t_{pulse}$ is equal to the expected duration of the RF pulse plus this extra added time.

In some variations, the matched filter is implemented on an FPGA to perform real-time analysis using a previously measured waveform that has been averaged over 103 cycles. In these variations, the outgoing RF pulse is not used as the expected template as the atomic response shape does not exactly match the square RF pulse envelope. Moreover, unlike conventional radar receivers, the FPGA may be directly coupled to the vapor cell sensor without an intermediate filter or amplifier. As the overall pulse shape varies minimally with RF amplitude, the same expected pulse template can be used for the matched filter at different RF amplitudes. However, a mismatch between the time constant of the pulse edges and the template may result in a slight shift of the extracted pulse timing combined with a slight reduction in noise. The slight shift and reduction in noise are discussed further in relation FIGS. 12A-12F. These effects become more apparent as the RF field amplitude decreases, and could be remedied for by running the matched filter with more than one response template. For example, one response template could be tailored for detecting large RF fields and another response template could be run in parallel to sense weak fields, taking the maximum overlap of the two.

Figure 4B:
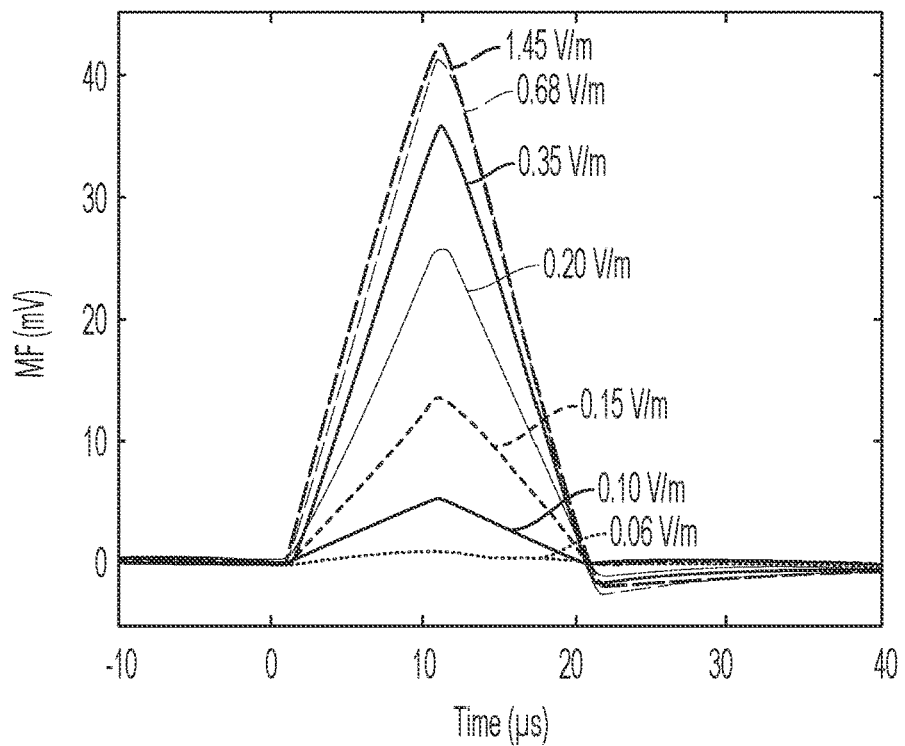
FIG. 4B is a graph of an output of an example matched filter when applied to the pulses shown in FIG. 4A.
Figure 4C:
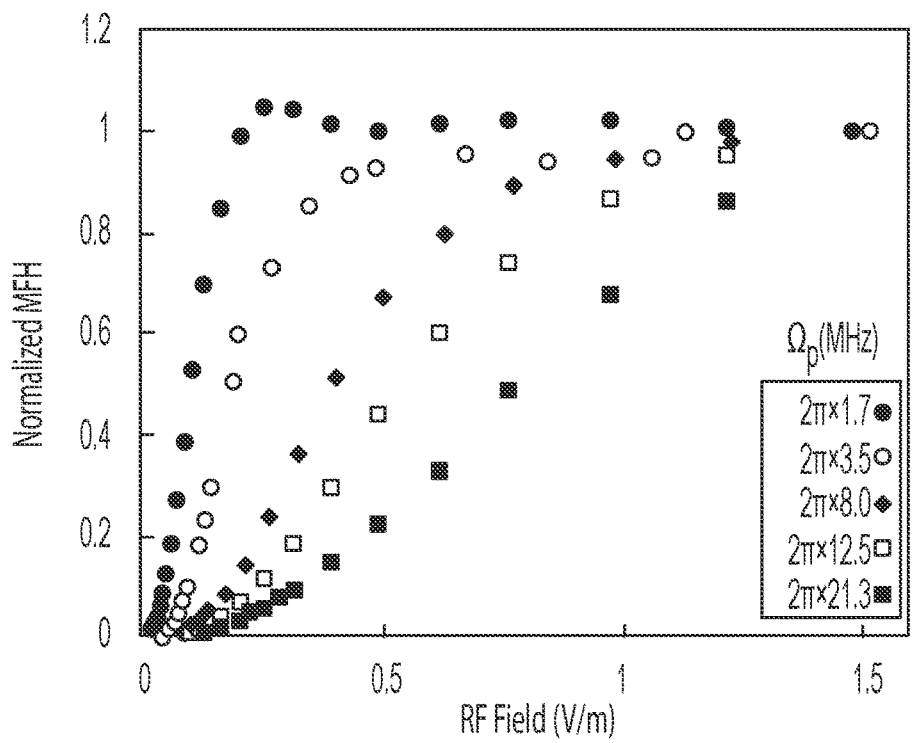
FIG. 4C is a graph of the peak height of the matched filter signal of FIG. 4B as a function of RF electric fields for a selection of IR probe laser powers.
Figure 4D:
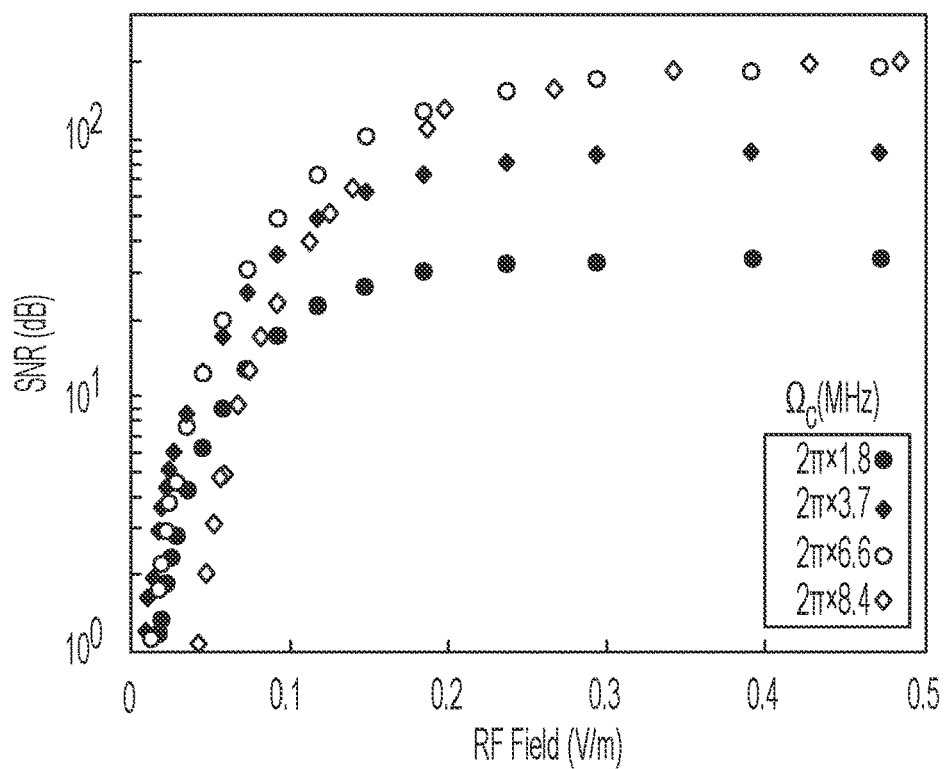
FIG. 4D is a graph of the signal-to-noise (SNR) ratio of the matched filter signal of FIG. 4B, as a function of RF power, as the green laser power is varied.

Now referring to FIG. 4A, a graph is presented of an example atomic response to a RF pulse of varying electric field amplitude, shown as both single traces (jagged lines) and traces averaged over 104 cycles (generally smooth lines). The inset shows the corresponding Autler-Townes splitting of the EIT peaks in response to continuous wave RF. Here, $\Omega_p = 2\pi \times 3.5$ MHz and $\Omega_c = 2\pi \times 8.4$ MHz. FIG. 4B presents a graph of the output of a matched filter (MF) when applied to pulses shown in FIG. 4A. The peak of the matched filter output gives the pulse timing. FIG. 4C presents a graph of the peak height of the matched filter signal of FIG. 4B as a function of IR laser power, ranging from 0.6 to 73 μW, normalized to the value at full EIT peak splitting (large RF field) at fixed $\Omega_c = 2\pi \times 8.4$ MHz. FIG. 4D presents a graph of the signal-to-noise (SNR) ratio of the matched filter signal of FIG. 4B as the green laser power is varied from 1 to 25 mW (with fixed $\Omega_p = 2\pi \times 3.5$ MHz).

FIG. 4B shows the output of the matched filter applied to individual pulses under the same conditions as in FIG. 4A.

The pulse timing output by the matched filter is 11.1 μs, as an expected pulse template is used that is 1.1 us longer than the 10 us pulse in order to include matching of the slow trailing edge of the atomic response. The matched filter can suppress much of the noise seen on single pulses, allowing the timing of weaker amplitude RF pulses to be extracted.

As the EIT peak width is strongly influenced by the combination of probe and coupling Rabi frequencies (i.e., the IR and green laser powers), these frequencies are varied to determine the optimal conditions for detecting weak RF fields. FIG. 4C shows the matched filter peak height as a function of $\Omega_p$ for a fixed intermediate green power. In general, because total absorption scales with beam intensity, larger $\Omega_p$ leads to a larger raw pulse depth and therefore a larger matched filter peak and SNR. However, the avalanche photodetector can saturate at high IR powers, requiring the addition of a neutral density filter before the photodetector. So for a better comparison, the matched filter peaks for a given $\Omega_p$ have been normalized to the value at the largest RF field. Thus, FIG. 4C can map changes in EIT peak width and overlap as a function of RF amplitude and $\Omega_p$. At low $\Omega_p$ the EIT peaks are narrower, so that the Autler-Townes regime becomes extended and a lower RF field can be reached before the peaks begin to overlap and the pulse amplitude decreases. If the aim is to maximize the sensitivity to weak RF fields, then lower $\Omega_p$ is desirable. In contrast, if the aim is to differentiate a wide range of RF field strengths, then higher $\Omega_p$ is preferable as the pulse depth varies gradually with RF field due to wide overlapping EIT peaks.

FIG. 4D shows changes in signal-to-noise (SNR) ratio as $\Omega_c$ is varied while $\Omega_p$ is held at an intermediate value. Here, SNR is defined as the ratio of the matched filter peak height to the standard deviation of the matched filter noise. Reducing $\Omega_c$ improves the SNR at the lowest RF fields by narrowing the EIT peaks. However, such an improvement may reduce the SNR at high RF fields due to lower EIT peak amplitude. Further reductions beyond a certain $\Omega_c$, here around $2\pi \times 3.5$ MHz, can be detrimental to the SNR at all RF fields.

Figure 5A:
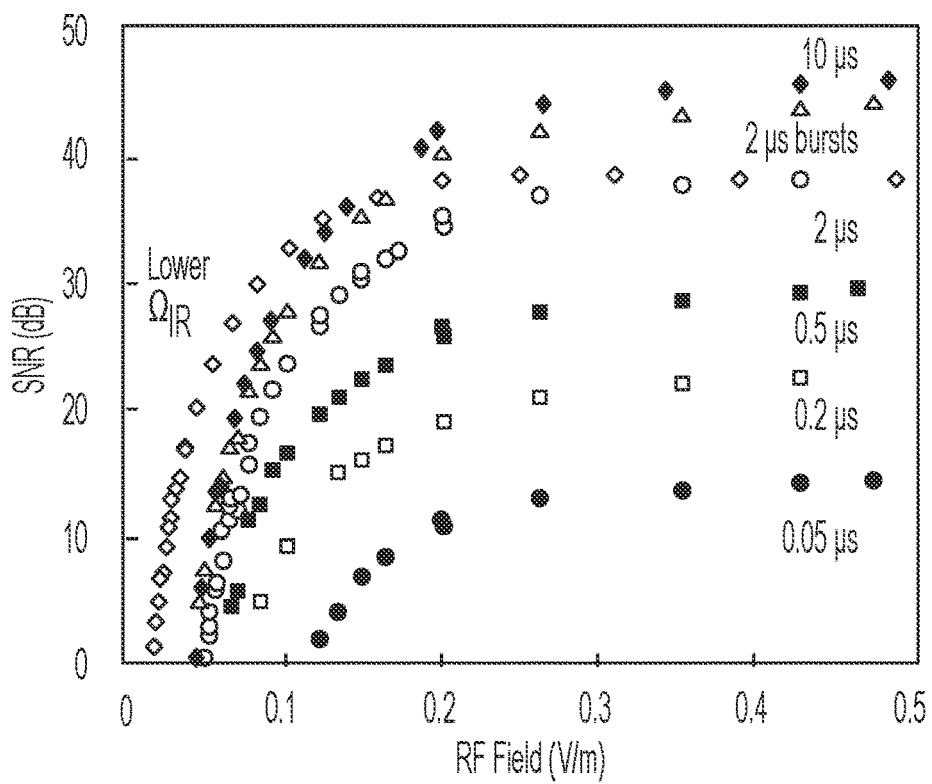
FIG. 5A is a graph of the signal-to-noise (SNR) ratio of an example matched filter shown for various RF pulse lengths, a burst of three 2 us pulses spaced by 2 µs, and 10 us pulses taken at a lower IR power.
Figure 5B:
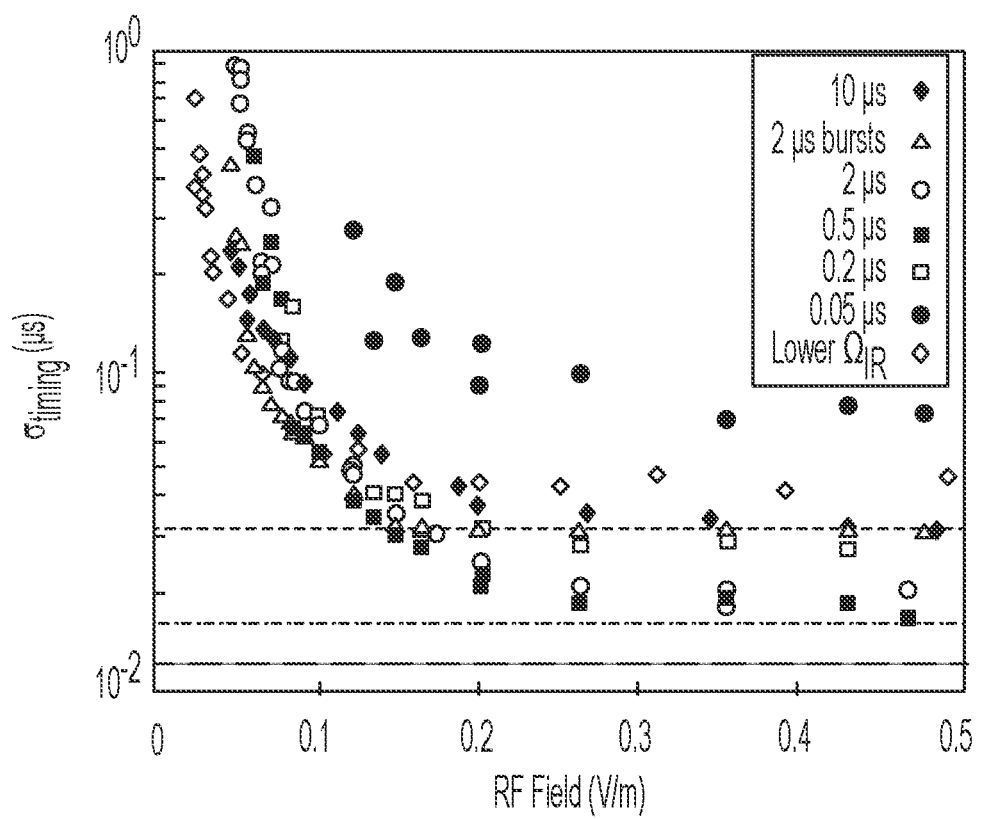
FIG. 5B is a graph of the standard deviation of a Gaussian fit to pulse timings measured using a matched filter peak for the various pulse conditions in FIG. 5A.

Now referring to FIG. 5A, a graph is presented of the signal-to-noise (SNR) ratio of an example matched filter shown for various RF pulse lengths, a burst of three 2-μs pulses spaced by 2-μs (open triangles), and pulses taken at a lower IR power (open diamonds). Here, $\Omega_p = 2\pi \times 1.7$ MHz instead of $2\pi \times 3.5$ MHz. FIG. 5B presents a graph of the standard deviation of a Gaussian fit to pulse timings measured from the matched filter peak for the various pulse conditions in FIG. 5A. Dashed horizontal lines correspond to limits due to the finite sampling rate of the FPGA implementing the matched filter.

In FIGS. 5A and 5B, the SNR and timing precision of different pulse lengths and sequences is shown at laser conditions that give the overall highest SNR, e.g., $\Omega_p = 2\pi \times 3.5$ MHz and $\Omega_c = 2\pi \times 8.4$ MHz. The timing precision of detection is evaluated as the standard deviation of a Gaussian fit to a distribution of 300 pulse timings that is extracted during post-processing from the matched filter maxima. At larger RF fields, timing precision may be limited by the down sampling required to implement the matched filter on the FPGA. The FPGA may be restricted to a maximum number of datapoints in the expected pulse template, due to finite resources for simultaneously performing the required multiplications and summations in the convolution. Thus, for shorter pulses, the sampling rate of the FPGA can be increased. Limits from sampling rates are indicated as horizontal dashed lines in FIG. 5B, which depict half the sampling rate as the limit on the timing resolution for comparison with the standard deviation extracted.

If the EIT peaks are fully split then the SNR remains flat with varying RF field. However, the SNR begins to drop once overlap occurs at weaker RF fields. At a SNR of around about 15 dB, evidence begins to emerge that suggests false alarms. This evidence becomes more frequent at lower SNR. Pulses shorter than 2 us may not have time to reach full pulse depth because of the long time constant of the atomic response. Thus, the SNR of short pulses may suffer at all RF fields, and as a result, so can the timing precision of pulses shorter than 0.5 μs, which may be limited by noise rather than sampling rate at high RF fields. Despite these possibilities, short pulses can still be detected down to 50 ns widths.

The matched filtering may also be applied to bursts of pulses. As an example, a matched filed may be applied to a series of three 2-μs pulses spaced apart by 2-μs, with the total pattern being 10 μs long but containing a total energy lower than a single pulse. The burst pattern has a SNR lower than a single 10 μs-pulse at high RF field due to the lower energy, but maintains a similar SNR at low RF fields. The burst pattern produces a narrower peak in the matched filter output, which improves timing precision at low to moderate RF fields beyond that of either a single 2-μs or pulse. However, due to the addition of sidelobes in the matched filter pattern, the use of burst sequences may, in some cases, come with an added false alarm rate of about 5%, such as when the sidelobe exceeds the central peak. Improvements can be achieved by varying the amplitude of each pulse in the sequence based on compression techniques.

Using optimal laser conditions for detecting weak RF pulses (open diamonds in FIGS. 5A-5B), e.g., $\Omega_p=2\pi\times1.7$ MHz and $\Omega_c=2\pi\times8.4$ MHz as shown in FIG. 5A, the RF field sensitivity can reach a limit of about 170 μV/cm when the SNR approaches one. For a 2-μs sensing time, this sensitivity corresponds to a sensitivity of approximately 240 nV cm$^{-1}$ Hz$^{-1/2}$. When the SNR approaches 15 dB and occasional false alarms become more probable (e.g., corresponding to an RF field limit of about 330 μV/cm), a 2-μs sensing time can yield an effective sensitivity of 470 nV cm$^{-1}$ Hz$^{-1/2}$. Such sensitivities can be obtained in real time on single pulses, without the need for an auxiliary reference RF field. The detectable field range can be further extended by using an amplifier as part of the vapor cell receiver, e.g., a dish to amplify the RF field at the vapor cell, or by averaging over several pulses. A photonic crystal receiver can also be used.

Figure 6A:
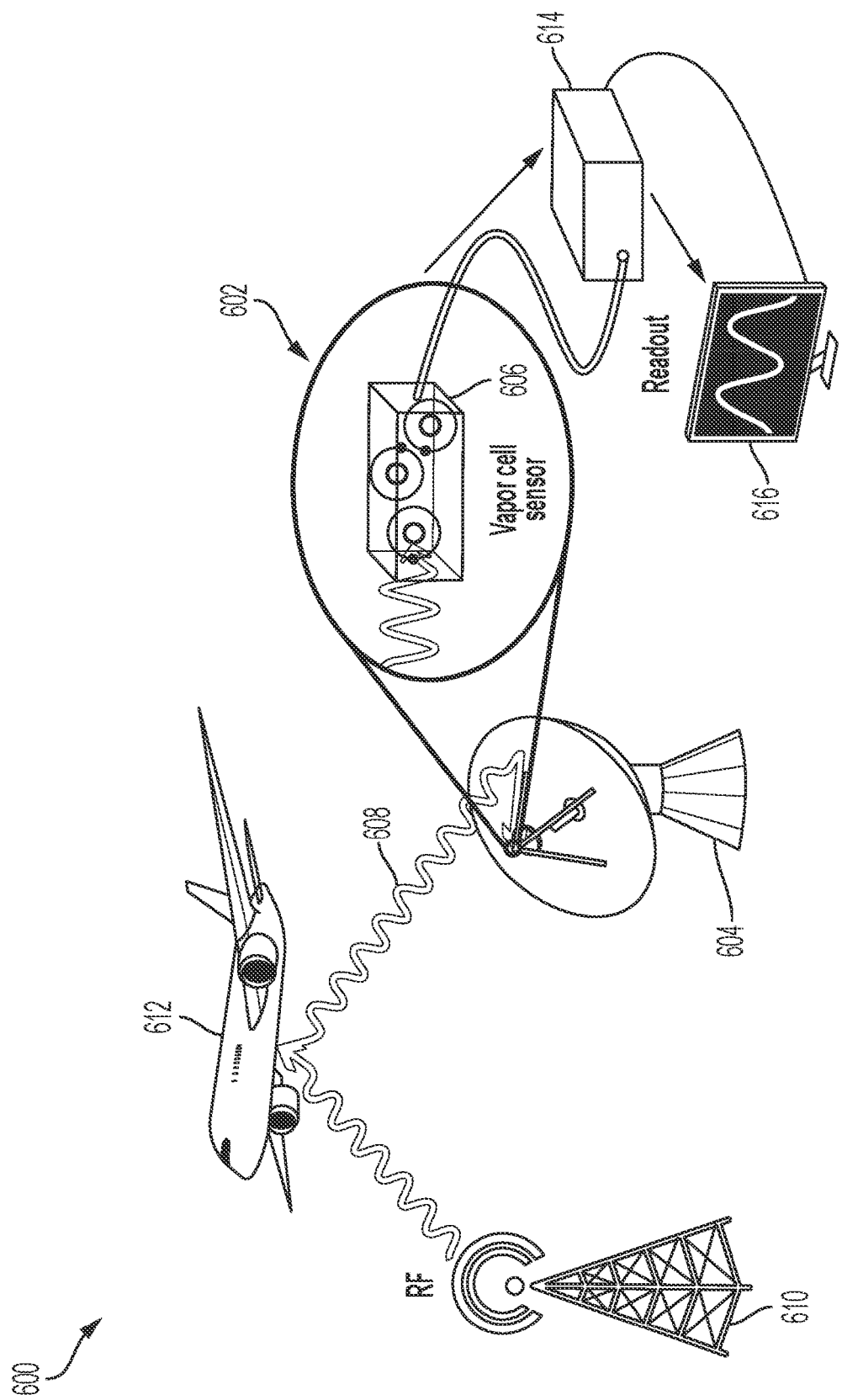
FIG. 6A is a schematic diagram of an example system that includes a vapor cell sensor system and an RF optic.

The matched filter may be useful in detecting RF pulses associated with radar signals. For example, FIG. 6A presents a schematic diagram of an example system 600 that includes a vapor cell sensor system 602 and an RF optic 604. The example system 600 may be configured to detect signals, such as radar signals or communication signals. The vapor cell sensor system 602 includes a vapor cell sensor 606, which may be analogous to the vapor cell sensor 106 described in relation to FIG. 1. In some variations, the vapor cell sensor system 602 includes a laser system that is configured to generate beams of light that pass through a vapor of the vapor cell sensor 606 (e.g., a probe beam of light). The RF optic 604 is configured to direct an RF field 608 onto the vapor cell sensor 606. The RF field 608 may include one or more RF pulses that define a signal, such as a radar signal or a communication signal. In some instances, the RF field 608 is generated by a remotely located RF source 610 (e.g., a radar tower). In some instances, the RF field 608 is reflected off a moving object 612 (e.g., an aircraft). The RF field 608, when directed onto the vapor cell sensor 606, interacts with the vapor of the vapor cell sensor 606 to alter an optical transmission through the vapor (e.g., via an EIT mechanism). The altered optical transmission may, in turn, alter an optical property one or more of the beams of light (e.g., the probe beam of light) as the beams of light pass through the vapor.

In some variations, such as shown in FIG. 6A, the RF optic 604 is a dish. The dish can, for example include a hemispherical wall that curves about a focal point of the dish. The hemispherical wall may have dimensions suitable for receiving the RF field 608 from an ambient environment of the example system 600. The dimensions may also allow the hemispherical wall to direct the RF field 608 onto the focal point of the dish. The hemispherical wall may, in certain cases, be formed of metal (e.g., aluminum, steel, etc.). In some variations, such as shown in FIG. 6A, the vapor cell sensor 606 is disposed at the focal point of the dish. For example, the dish may include a support arm that extends from an edge of the dish and terminates in an end at or near the focal point. The vapor cell sensor 606 may be coupled to this end. In some variations, the hemispherical wall concentrates the RF field 608 onto the vapor cell sensor 606 (and vapor therein) when directing the RF field 608 onto the focal point. Such concentration may be beneficial in situations where the RF field 608 is weak. In some variations, the RF optic 604 is an RF lens. Examples of the RF lens include a Teflon lens, a metamaterial lens, or a gradient index lens. However, other types of RF optics 604 are possible. Combinations of different types of RF optics are also possible.

The example system 600 also includes a signal processing system 614, and in some variations, a computer system 616 in communication with the signal processing system 614. The computer system 616 may allow a user to interact with and control the example system 600. The signal processing system 614 is configured to perform operations that include generating a digital signal based on a signal from the vapor cell sensor system 602. The digital signal represents a measured response of a vapor of the vapor cell sensor 606 to the RF field 608 over a time period. The operations also include applying a matched filter to the digital signal to generate a filtered signal. The filtered signal is generated based on a comparison of the digital signal with a response template, and the response template represents a known response of the vapor to a target RF pulse. The operations additionally include processing the filtered signal to determine properties of the RF field sensed by the vapor cell sensor over the time period. In some variations, processing the filtered signal includes detecting a sequence of RF pulses. For example, the one or more RF pulses may define a radar signal and the signal processing system 614 may be configured to identify an aircraft as a source of the sequence of RF pulses. As another example, one or more RF pulses may define a communication signal that is transmitted from a communication station (e.g., a satellite, an aircraft, a vehicle, a boat, a broadcast antenna, etc.). In these cases, the signal processing system 614 may be configured to identify data represented by the communication signal.

Figure 6B:
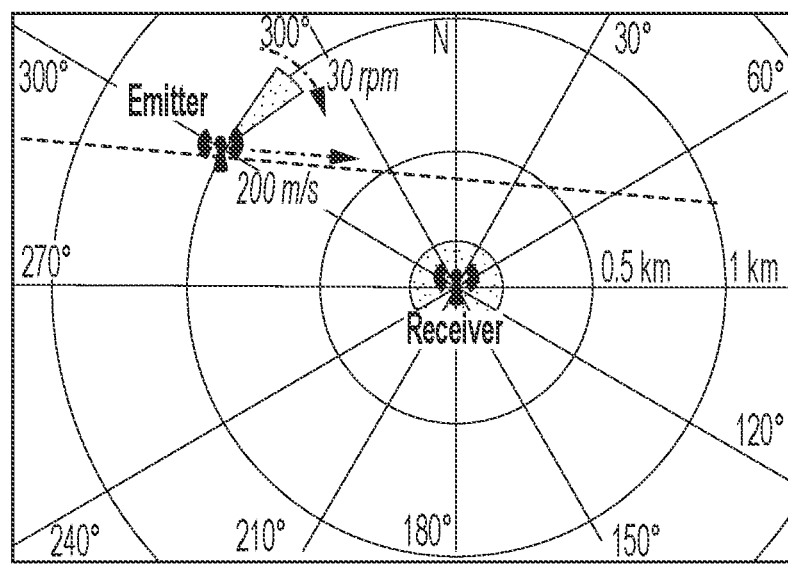
FIG. 6B is a polar graph of an example scenario that represents a rotating emitter on an aircraft as it flies by a fixed vapor cell receiver.
Figure 6C:
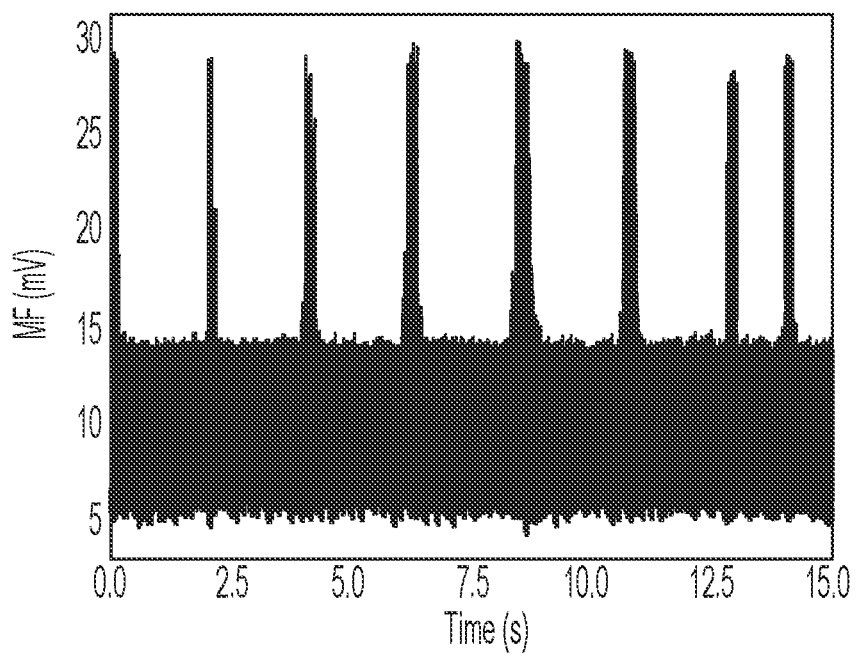
FIG. 6C is a graph of an example signal detected by the fixed vapor cell receiver of FIG. 6B after matched filtering.

FIG. 6B presents a polar graph of an example scenario that represents a rotating emitter on an aircraft as it flies by a fixed vapor cell receiver. The fixed vapor cell receiver emits 1-μs pulses at a repetition frequency of 10 kHz. FIG. 6C presents a graph of an example signal detected by the fixed vapor cell receiver of FIG. 6B after matched filtering. The fixed vapor cell receiver produces clusters of pulses whenever the emitter's antenna rotates to face the receiver.

Figure 6D:
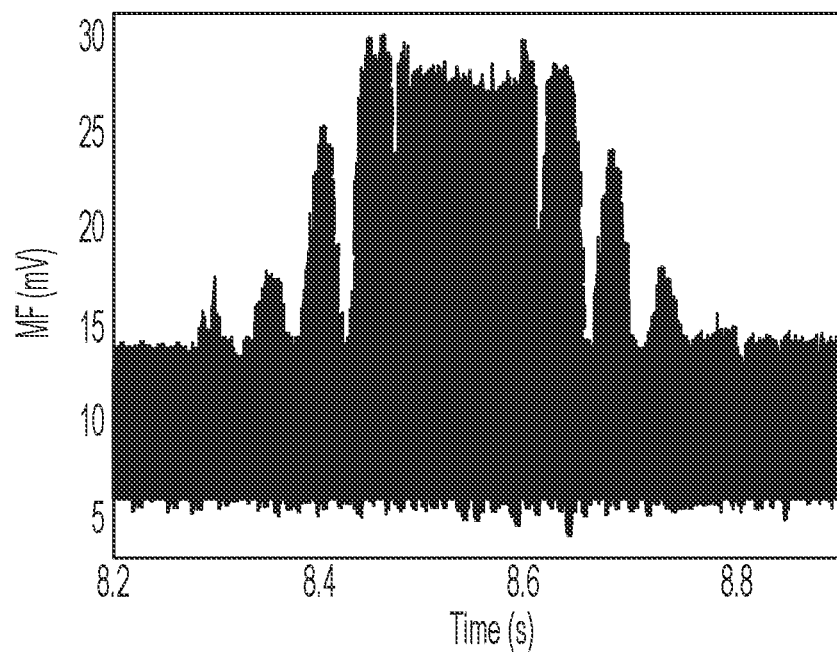
FIG. 6D is a graph of a single pulse cluster from the example signal of FIG. 6C, showing the pattern formed from a single rotation of the antenna.
Figure 6E:
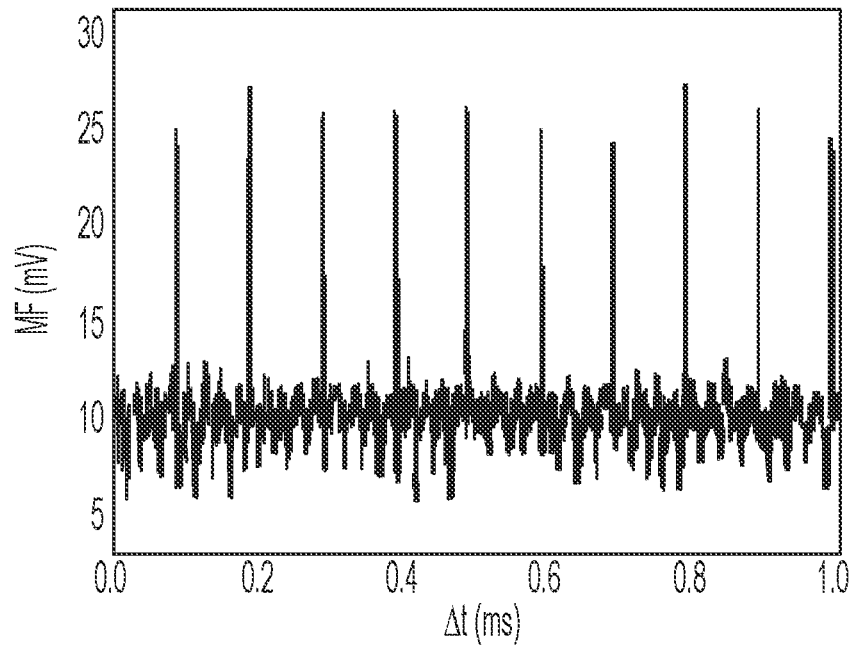
FIG. 6E is a graph from a central lobe of the single pulse cluster shown in FIG. 6D.

FIG. 6D presents a graph of a single pulse cluster from the example signal of FIG. 6C, showing the pattern formed from a single rotation of the antenna. The pattern includes a large central peak with multiple weaker sidelobes. FIG. 6E presents a graph of a central lobe of the single pulse cluster shown in FIG. 6D. The central lobe is approximately 8.5 s, and FIG. 6D shows the matched filter output from individual 1-μs pulses. Here, $\Omega_p=2\pi\times7.8$ MHz, $\Omega_c=2\pi\times8.4$ MHz.

FIG. 6B demonstrates the detection of radar signals produced by an aircraft flying past a vapor cell receiver (or sensor) along a flight path. The radar signal is produced by a vector signal generator that simulates the power and timing of pulses that would reach the vapor cell receiver. The vector signal generator accounts for the changing distance and produces a peak power of around 6 dBm, which is sent to an RF horn antenna near the vapor cell receiver. In the example scenario, the aircraft travels at a typical commercial airplane speed of 200 m/s at around 1 km from the vapor cell receiver. On board the aircraft is a spinning antenna rotating at 30 rpm, emitting 1-μs long pulses at a repetition rate of 10 kHz. Laser conditions for detecting the pulses from the aircraft corresponding to the highest RF field sensitivity, e.g., $\Omega_p=2\pi\times1.7$ MHz and $\Omega_c=2\pi\times8.4$ MHz.

FIG. 6C shows the 15-s long radar pattern seen through the atomic response of the vapor cell receiver, processed with the FPGA-implemented matched filter. Pulses are visible when the emitter faces the receiver, producing a cluster of spikes with varying amplitude shown in FIG. 6D that correspond to a typical antenna pattern. The peak of an individual pulse output by the atomic system and matched filter generally scales with the received RF pulse amplitude, but in the nonlinear fashion shown in FIG. 4C. A possible consequence of the scaling is that fields above about 0.2 V/m (or power of about −10.7 dBm) cannot be distinguished due to saturation at the laser conditions used for the demonstration. This behavior is unlike at lower RF fields where the peak splitting and pulse depth are approximately linear, e.g., 0.04 to 0.2 V/m (or power of −24.8 to −13.3 dBm) or quadratic, e.g., less than 0.04 V/m (or power of −24.8 dBm). Due to the saturation in pulse depth once the Autler-Townes peaks are fully split, the central lobe in FIG. 6D is flat rather than rounded like the sidelobes. Furthermore, the first sidelobe has a slightly higher amplitude than the central lobe due to the enhanced absorption on the sides of the EIT peak.

Sidelobes of decreasing field strength may be observed as the antenna spins around. As the aircraft approaches the receiver, the RF field at the vapor cell receiver increases and more sidelobes can be distinguished above the noise floor. At its closest approach, four sidelobes on each side of the central peak can be detected compared to only one at the extremes of the flight path. To detect an aircraft from further away or distinguish weaker sidelobes, an increase in emitted pulse length, an increase in vapor cell depth, an addition of an amplifier at the receiver, or a reduction in noise sources, or a photonic crystal vapor cell may be required. In certain cases, the detection system may become dominated by optical frequency and amplitude noise from the lasers and their locking process, with some smaller delays and noise added from the FPGA processing.

Applications of the Rydberg atom-based sensors include radar receivers (e.g., that detect pulses emitted by an aircraft antenna) and communication systems. The Rydberg atom-based sensors may be based on a Cs vapor cell, such as described above. The Cs vapor cell at room temperature may have a rapid transient response to the application of pulse-modulated RF fields and can detect RF pulses down to sub-50 ns. The atomic response time to RF fields being turned on generally can, in some instances, include two timescales: a short approximately 50 ns transient followed by a longer microsecond decay that depends on the transit time of Rydberg-Rydberg collisional by-products out of the laser beam. The response to RF fields being removed can be slower due to a sudden increase in Rydberg-Rydberg interactions and electric fields. Using a matched filter based on the atomic response shape, the vapor cell sensor can detect single shot RF pulses down to amplitudes of about 170 μV/cm, with a sensitivity of about 240 nV cm$^{-1}$ Hz$^{-1/2}$, and with a timing precision of about 30 ns, all without an auxiliary RF field. In many cases, narrow EIT peaks and weak laser conditions are optimal for the highest sensitivity to low target fields, while higher laser powers are preferred for calibration across a broader amplitude range.

Figure 7A:
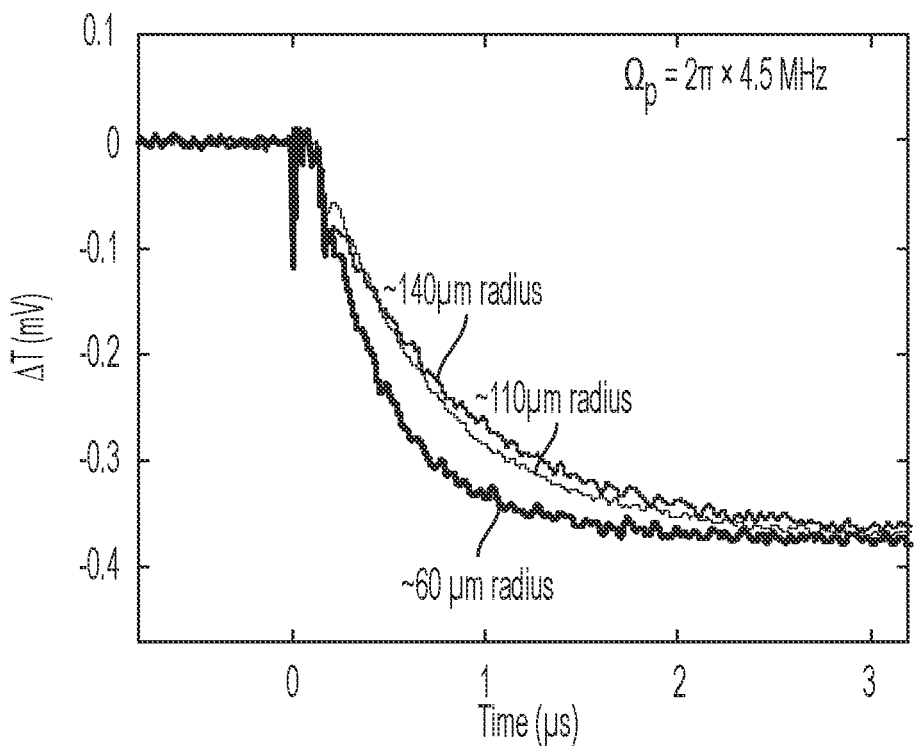
FIGS. 7A-7B are graphs showing the effects of laser beam size on pulse shape.
Figure 7B:
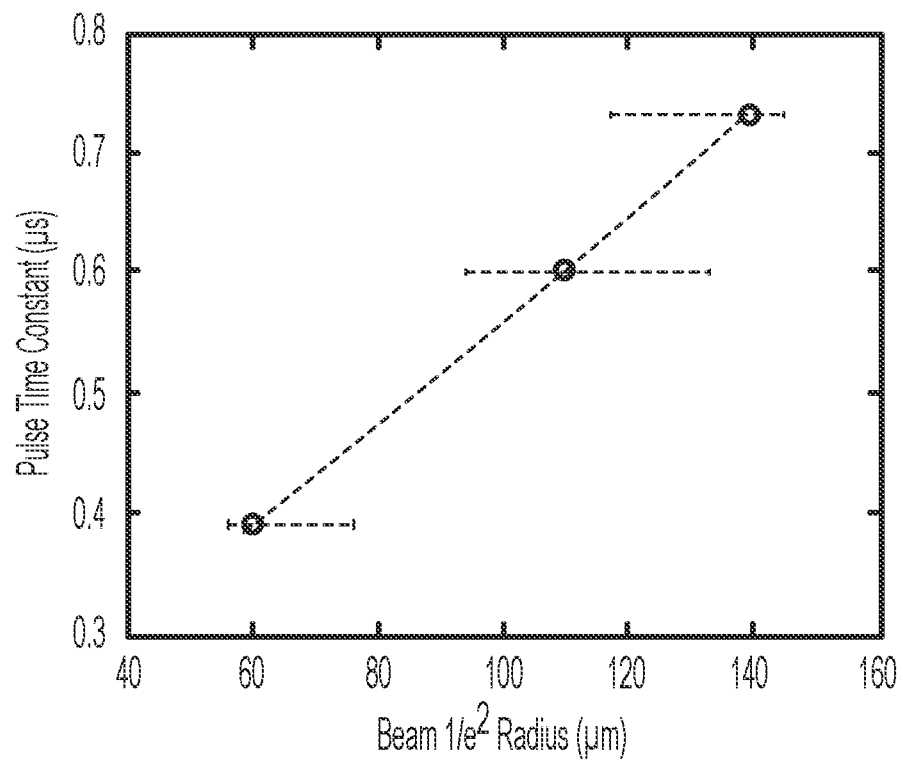

Now referring to FIGS. 7A and 7B, graphs are presented that show the effects of laser beam size on pulse shape. In FIG. 7A, the graph shows that increasing the radius of the interaction volume (e.g., the overlap of the probe and coupling beams in the example case) radius slows the atomic response at the leading edge of the pulse. FIG. 7B shows that the time constant extracted from an exponential fit to the leading edge of the pulse scales linearly with the IR beam radius. In the present case, the coupling beam is larger than any of the IR beams. The second slower time constant making up the leading edge of the atomic pulse response may be sensitive to the choice of laser beam radius, as shown in FIG. 7A. Here, the infrared beam radius is varied, and this radius is smaller than that of the green laser beam. A constant Rabi frequency is also maintained by increasing the infrared laser power. The initial, less than 50-ns transient present on the leading edge of pulses appears unaffected by the laser beam size, to within the bandwidth resolution of the photodetector. However, a time constant can be extracted from an exponential fit to the second slower decay of the pulse, and this time constant is found to scale monotonically with the IR laser beam's radius, as shown in FIG. 7B. Because the transit time of the atoms through the beam is directly proportional to its radius, the monotonic scaling demonstrates that this slower transient time scale of the pulse is dominated by the atomic transit time.

Figure 8A:
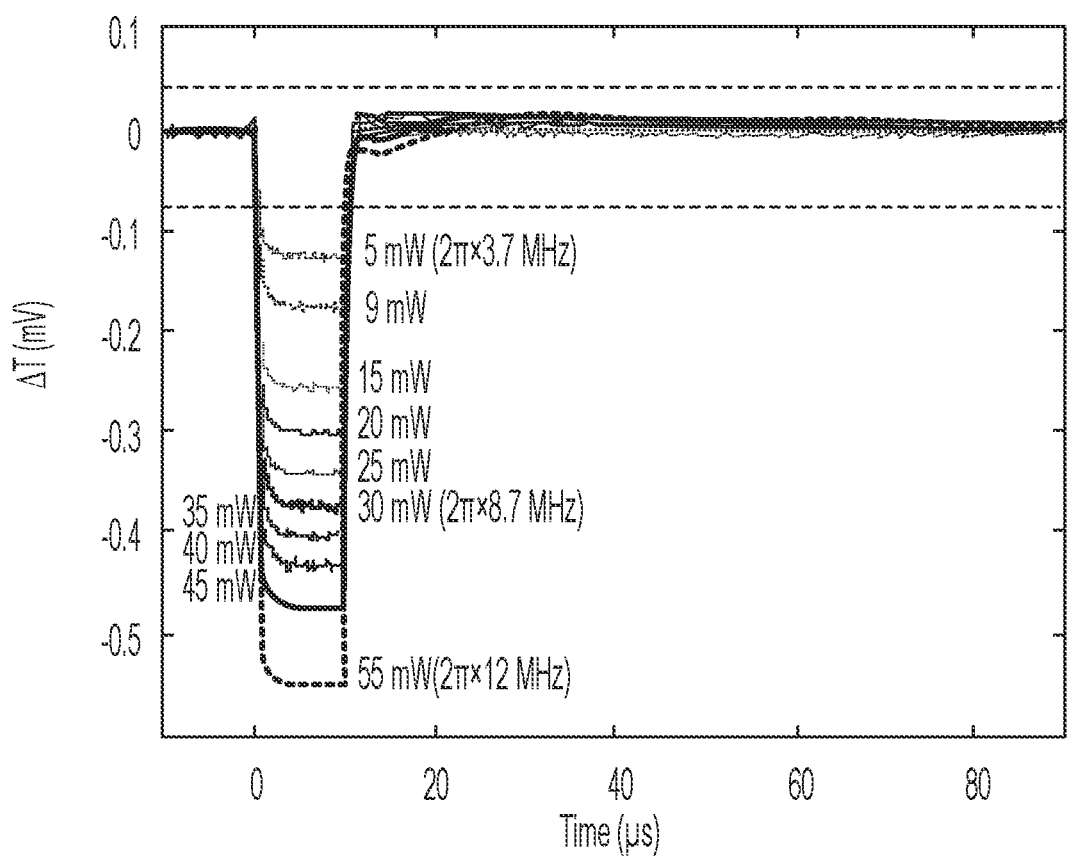
FIG. 8A is a graph showing the dependence, at various electric field powers, of a trailing edge of an RF pulse on a green Rabi frequency.
Figure 8B:
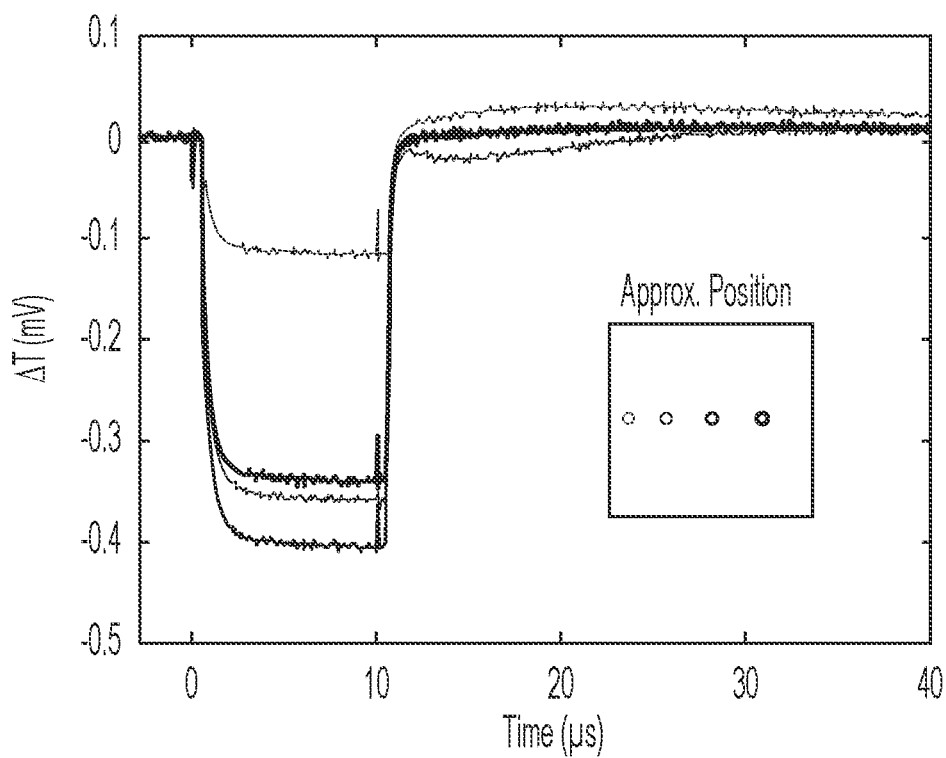
FIG. 8B is a graph of showing that, for an RF pulse, a shape of the trailing edge may change with laser beam position while a shape of the leading edge may remain unchanged.
Figure 8C:
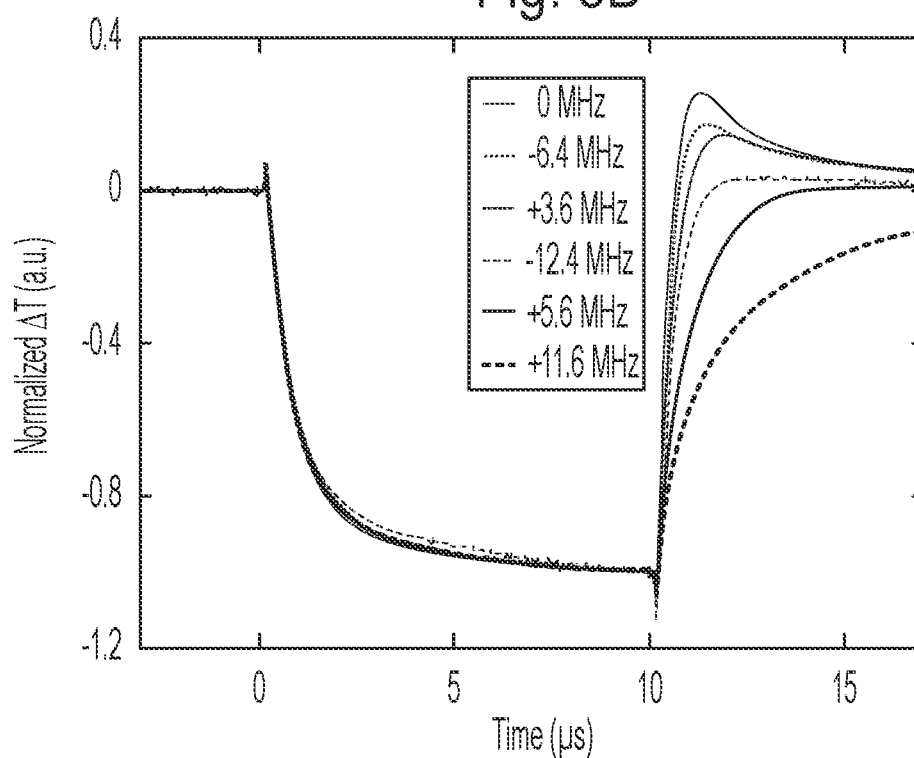
FIG. 8C is a graph showing the impact of green detuning on a tail of an experimental response to an RF pulse.

Now referring to FIGS. 8A-8C, graphs are presented that show the effects of electric field at different Rabi frequencies. In FIG. 8A, the trailing edge of the pulse depends on the green Rabi frequency, with a stronger lingering overshoot at higher Rabi frequencies. Here, $\Omega_p=2\pi\times1.8$ MHz. In FIG. 8B, while the shape of leading edge of the pulse does not change with laser beam position, the shape of the trailing edge does. The inset shows an approximate location for the laser beams within the short 1 cm×1 cm face of the cell, with the lasers going in and out of the page. In FIG. 8B, $\Omega_p=2\pi\times1.8$ MHz and $\Omega_c=2\pi\times10.5$ MHz. FIG. 8C shows that green detuning has a strong impact on the tail of the experimental response to an RF pulse. For FIG. 8C, $\Omega_p=2\pi\times34$ MHz, $\Omega_c=2\pi\times8.7$ MHz, and $\Omega_{MW}=2\pi\times119$ MHz.

The shape of the trailing edge depends on the green laser power, as shown in FIG. 8A, which will change the Rydberg state populations. Similarly, the shape can depend heavily on direction (blue or red detuning) and amount of green laser frequency detuning from resonance, as shown in FIG. 8C. Moreover, the shape and time scale of the trailing edge can depend on the laser position relative to the vapor cell walls, as shown in FIG. 8B. The depth of the pulse changes primarily due to changes in optical transmission due to electric field shifts that depend on the distribution of charges within the vapor cell, mostly stuck to the vapor cell walls. All these observations highlight that the slow trailing edge of the pulse can be sensitive to factors such as collisions, background electric fields in the vapor cell, generation of ions, and/or blockading.

Figure 9:
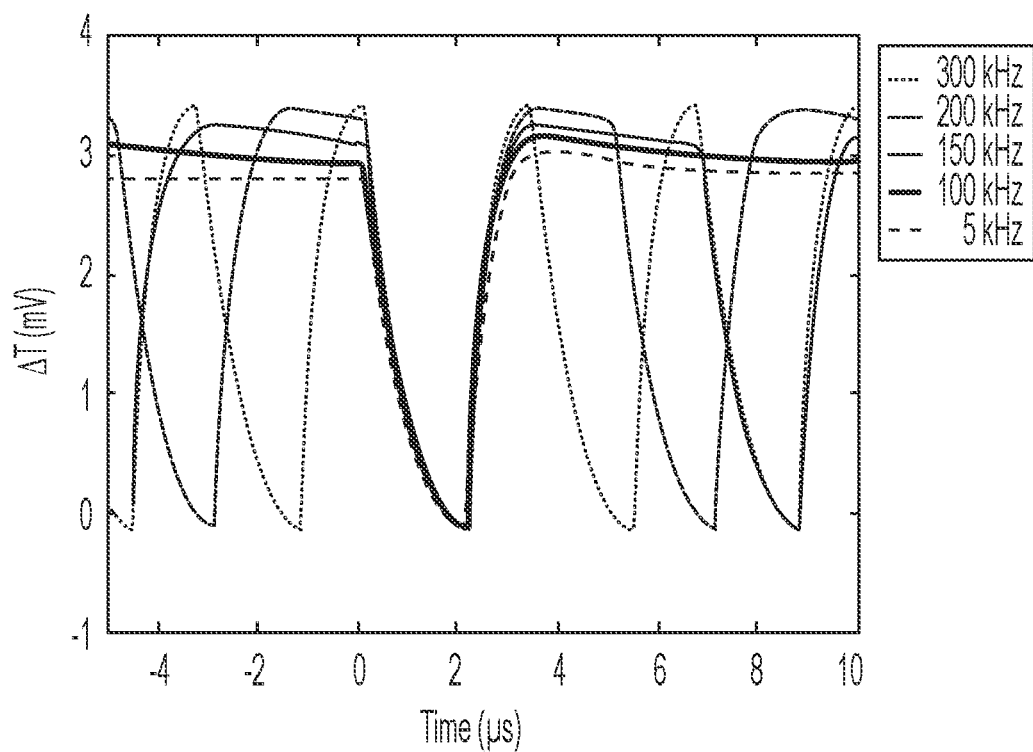
FIG. 9 is a graph showing the effects of repetition rate on pulse shape for 2 us long pulses.

Now referring to FIG. 9, a graph is presented showing the effects of repetition rate on pulse shape for 2 us long pulses. As the trailing edge of the pulse can linger for up to about 100 us before reaching steady state, the pulse shape will change slightly if the spacing between pulses is shorter. FIG. 9 shows that the overall pulse depth as well as the time scales of the leading and trailing edges vary slightly with pulse rate. Pulses with a higher repetition rate appear slightly easier to detect because of the increased pulse depth.

Figure 10A:
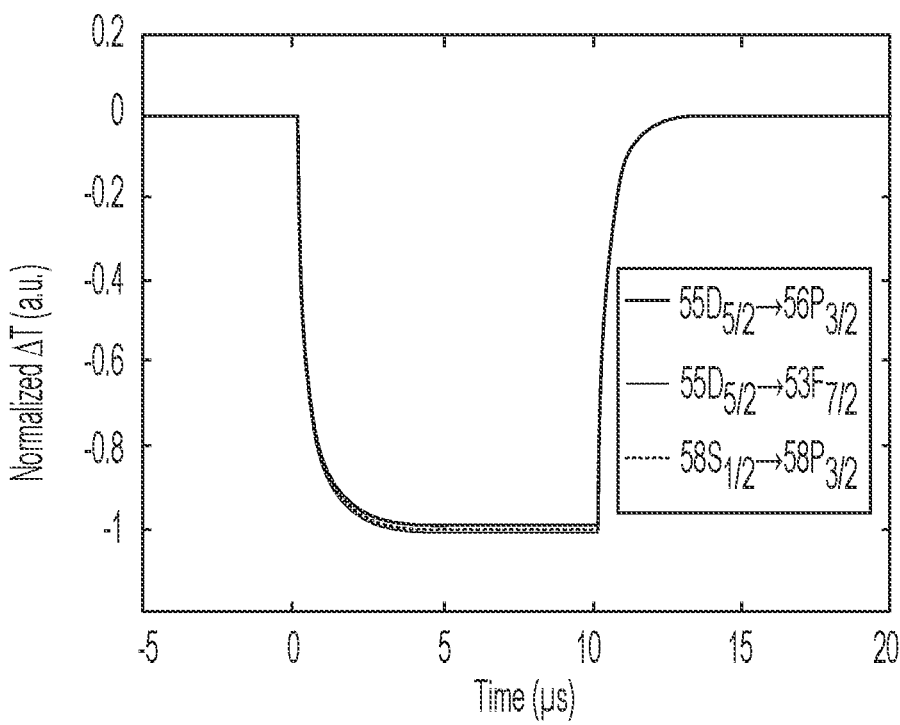
FIGS. 10A-10B are graphs showing effects of atomic transition choice on pulse shape at low and high Rydberg populations.
Figure 10B:
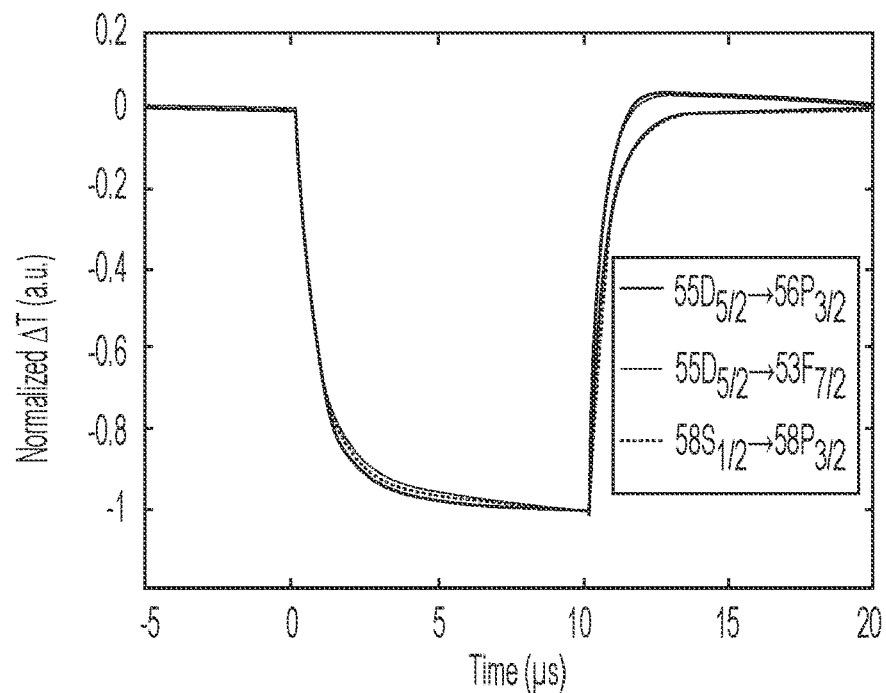

Now referring to FIG. 10A, a graph is presented showing the effects of atomic transition choice on pulse shape at low optical Rabi frequencies. In FIG. 10A, $\Omega_p=2\pi\times 1.8$ MHz and $\Omega_c=2\pi\times 2.5$ MHz. FIG. 10B presents a graph of the corresponding effects at high optical Rabi frequencies where $\Omega_p=2\pi\times 12.2$ MHz and $\Omega_c=2\pi\times 5.7$ MHz. Changes to the Rydberg and/or RF transitions have minimal impact on the leading edge of the experimental atomic response but can affect the trailing edge at high optical Rabi frequencies (e.g., $\Omega_{MW}=2\pi\times 60$ MHz), which correspond in the case to relatively large Rydberg state population.

FIGS. 10A and 10B present a characterization of whether the same pulse template can be used across different atomic transitions, and therefore at different RF frequencies. In addition to the $55D_{5/2} \leftrightarrow 53F_{7/2}$ transition (K-band 19.40 GHz microwaves), the $55D_{5/2} \leftrightarrow 56P_{3/2}$ transition (C-band 4.24 GHz microwaves) and $58S_{1/2} \chi 58P_{3/2}$ transition (18.94 GHz microwaves) are examined, with the green laser shifted to a different Rydberg state at large RF fields when the EIT peaks are fully split. At low laser powers (and therefore Rabi frequencies), which are optimal for weak RF pulse detection, the pulse shape appears identical among varying Rydberg and RF atomic state transitions, as shown in FIG. 10A. At higher optical powers, however, some changes to the trailing edge of the pulse can emerge, likely due to the varying collisional rates and polarizability among states.

Figure 11A:
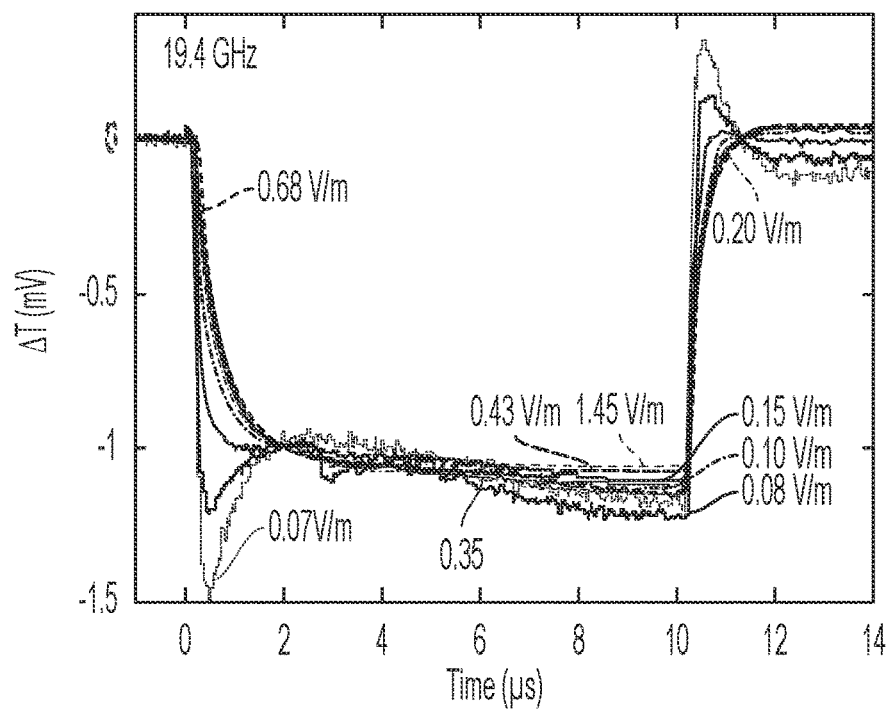
FIGS. 11A-11B are graphs showing the variation of pulse shape for RF fields at 19.4 GHz and 4.2 GHz for small RF electric fields.
Figure 11B:
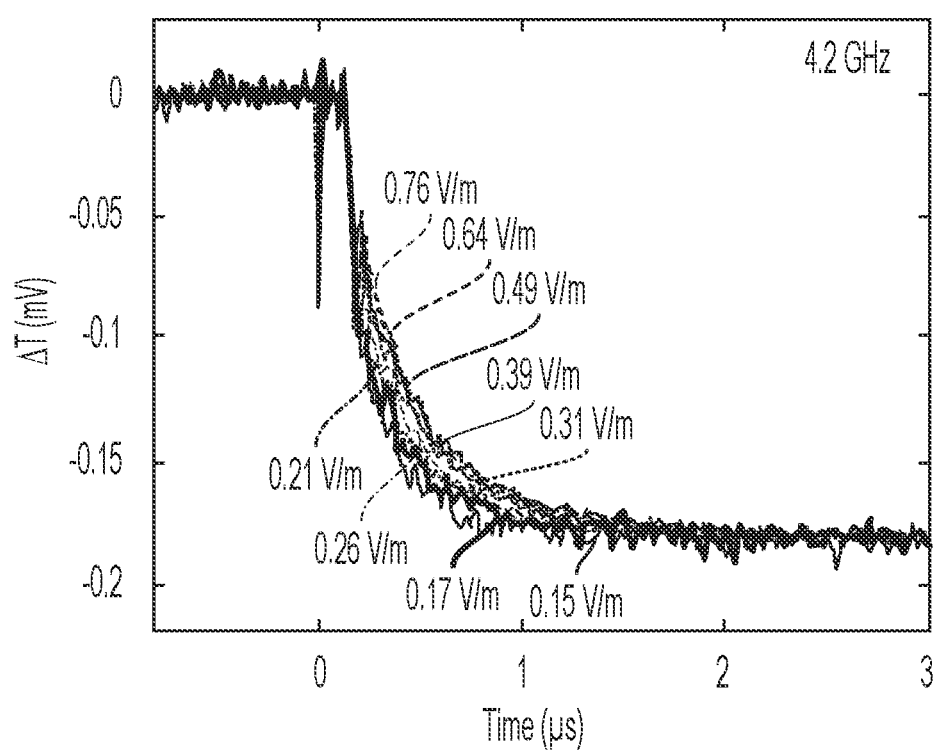

Now referring to FIGS. 11A and 11B, graphs are presented showing the variation of pulse shape for different RF fields at, respectively, 19.4 GHz and 4.2 GHz. Both graphs show that the atomic response is slightly more rapid at weaker RF fields. As the RF field is further decreased, overshoots begin to develop on each edge. Here, $\Omega_p=2\pi\times 3.5$ MHz and $\Omega_c=2\pi\times 8.4$ MHz. The graphs of FIGS. 11A and 11B provide insights into whether the pulse shape remains the same at all RF field amplitudes. For a large range of RF fields, the pulse shape remains largely the same, with only a subtle change to the slower time constant after the initial transient. This behavior indicates that the same matched filter template can be used for the large range of RF fields. At the smallest RF fields, the pulse shape begins to differ more substantially, with a rapid overshoot on both the leading and trailing edges. Changes to the unevenness of the pulse between about 2.5 us to 10 us may be due to amplitude fluctuations in the RF generator used, to which the atoms are more sensitive at weak RF fields (e.g., in the amplitude region of FIG. 4C).

Figures 12A, 12B, 12C, 12D, 12E, 12F:
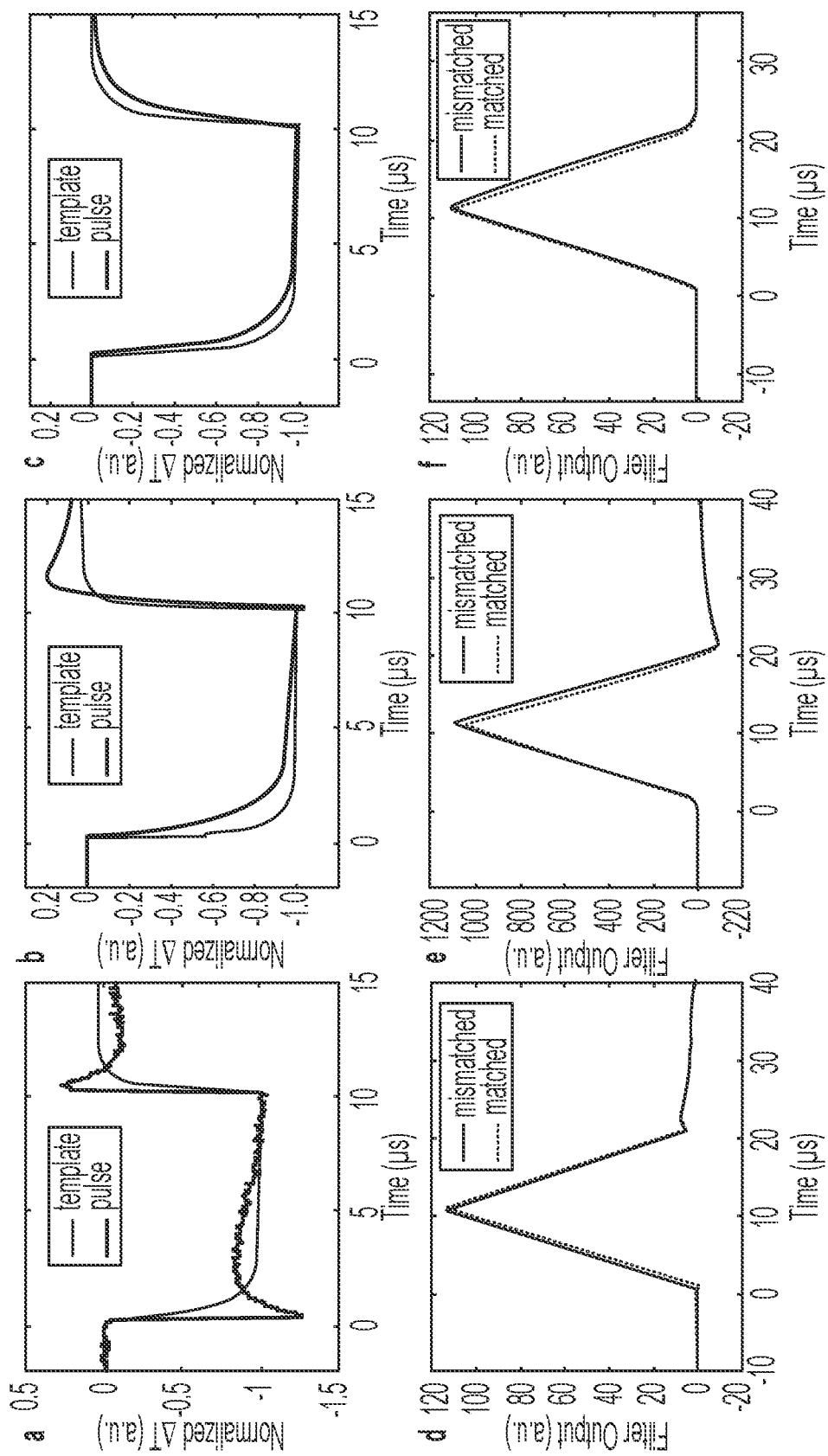
FIGS. 12A-12F are graphs comparing the effects of a matched filter template relative to an atomic pulse shape.

Now referring to FIGS. 12A-12F, graphs are presented comparing the effects of a matched filter template relative to an atomic pulse shape. These graphs show that the effects of using a matched filter template do not fully match the atomic pulse shape. FIGS. 12D-12F show the matched filter output as a solid line if the pulse shown in the panel (light solid line) above is matched to itself for an ideal fit. The matched filter output is shown as a dotted line for the scenario where the pulse in the panel above (light solid line) is matched to the pulse template in the panel above (heavy solid line). The overall filter output remains largely the same, but can shift the extracted pulse timing slightly.

In general, and as discussed above in relation to FIGS. 7A-11B, the exact time scales of the leading and trailing edges of the pulse can depend on many factors relating to the vapor cell sensor itself (e.g., electric fields, temperature, vapor pressure), the lasers (e.g., power, radii, frequency detuning), the choice of atomic states, and the RF field amplitude. FIGS. 12A-12F illustrate what may happen if the matched filter template is not quite a perfect match to the underlying pulse shape being detected. Differences in the time scales comprising the pulse, or the presence of overshoots on the edges, result in slight shifts to the pulse time extracted at the maximum of the filter output that are generally less than 0.5 μs. The direction of the shift can be later or earlier, depending on the nature of the pulse-template mismatch.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

In some aspects of what is described, a system may be described by the following examples:

Example 1. A system comprising:
  a laser system configured to generate beams of light that include a probe beam of light;
  a vapor cell sensor having a vapor therein and configured to allow the beams of light to pass through the vapor;
  an optical detector configured to generate a detector signal based on the probe beam of light after the probe beam has passed through the vapor; and
  a signal processing system configured to perform operations that comprise:
    receiving the detector signal from the optical detector over a time period,
    generating a digital signal based on the detector signal, the digital signal representing a measured response of the vapor to an RF field experienced by the vapor over the time period,
    applying a matched filter to the digital signal to generate a filtered signal, the filtered signal generated based on a comparison of the digital signal with a response template, the response template representing a known response of the vapor to a target RF pulse, and
    processing the filtered signal to determine properties of the RF field experienced by the vapor over the time period.

Example 2. The system of example 1, wherein processing the filtered signal comprises:
  determining at least one of a start time, a duration, or an amplitude of an RF pulse experienced by the vapor in the time period.

Example 3. The system of example 1 or example 2, comprising:
  a source of the RF field that is configured to produce RF pulses;
  wherein the response template is based on a plurality of reference RF pulses generated by the source over a reference time period, the plurality of reference RF pulses defining the RF field and sharing a common pulse shape.

Example 4. The system of example 1 or example 2, wherein the response template is based on a computer simulation of a response of the vapor to the target RF pulse.

Example 5. The system of example 1 or any one of examples 2-3, wherein the signal processing system comprises a high pass filter configured to block a portion of the detector signal that has a frequency less than a threshold frequency.

Example 6. The system of example 5, wherein the threshold frequency is less than or equal to 100 Hz.

Example 7. The system of example 1 or any one of examples 2-6,
  wherein the response template is a first response template that represents a first known response of the vapor to a first type of target RF pulse; and
  wherein the filtered signal is generated based on a comparison of the digital signal with: the first response template, and
    a second response template that represents a second known response of the vapor to a second type of target RF pulse.

Example 8. The system of example 7, wherein the first and second types of target RF pulses have different, non-overlapping ranges of field strength.

Example 9. The system of example 1 or any one of examples 2-8, wherein the detector signal is based on at least one of an amplitude, a polarization, or a phase of the probe beam of light.

In some aspects of what is described, a method may be described by the following examples:

Example 10. A method comprising:
  passing beams of light through a vapor in a vapor cell sensor, the beams of light comprising a probe beam of light;
  allowing an RF field to interact with the vapor;
  generating, by operation of an optical detector, a detector signal that is based on the probe beam of light after the probe beam has passed through the vapor;
  receiving the detector signal at a signal processing system over a time period; and
  by operation of the signal processing system:
    generating a digital signal based on the detector signal, the digital signal representing a measured response of the vapor to the RF field over the time period,
    applying a matched filter to the digital signal to generate a filtered signal, the filtered signal generated based on a comparison of the digital signal with a response template, the response template representing a known response of the vapor to a target RF pulse, and
    processing the filtered signal to determine properties of the RF field experienced by the vapor over the time period.

Example 11. The method of example 10, wherein applying a matched filter comprises applying a convolution function to the digital signal and the response template to generate the filtered signal.

Example 12. The method of example 11, wherein a period of the response template for the convolution function is greater than an expected duration of a pulse of the RF field.

Example 13. The method of example 10 or any one of examples 11-12, wherein processing the filtered signal comprises:
  determining at least one of a start time, a duration, or an amplitude of an RF pulse experienced by the vapor in the time period.

Example 14. The method of example 10 or any one of examples 11-13,
  allowing reference RF pulses to interact with the vapor, the reference RF pulses sharing a common pulse shape;
  receiving a reference detector signal at the signal processing system over a reference time period; and
  by operation of the signal processing system:
    generating a reference digital signal based on the reference detector signal, the reference digital signal representing a measured response of the vapor to the reference RF pulses over the reference time period, and generating the response template based on the reference digital signal.

Example 15. The method of example 14, wherein generating the response template comprises:

determining, for each reference pulse, a pulse shape based on a portion of the digital signal associated with a duration of the reference pulse; and averaging the pulse shapes to generate the response template.

Example 16. The method of example 10 or any one of examples 11-13, comprising:

generating the response template based on a computer simulation of a response of the vapor to the target RF pulse.

Example 17. The method of example 10 or any one of examples 11-16, wherein the detector signal is based on at least one of an amplitude, a polarization, or a phase of the probe beam of light.

Example 18. The method of example 10 or any one of examples 11-17, comprising:

filtering the detector signal to remove a portion that has a frequency less than a threshold frequency.

Example 19. The method of example 18, wherein the threshold frequency is less than or equal to 100 Hz.

Example 20. The method of example 10 or any one of examples 11-19, wherein interacting the RF field comprises interacting the RF field with the vapor during at least part of the time period.

Example 21. The method of example 10 or any one of examples 11-20, comprising:

allowing a heterodyne RF field to interact with the vapor, the heterodyne RF field comprising a continuous wave (CW) RF field over the time period;

wherein the digital signal represents a measured response of the vapor to a mixed RF field over the time period, the mixed RF field comprising the heterodyne RF field and the RF field; and wherein processing the filtered signal comprises processing the filtered signal to determine properties of the mixed RF field experienced by the vapor over the time period.

Example 22. The method of example 10 or any one of examples 11-21, wherein the response template is a first response template that represents a first known response of the vapor to a first type of target RF pulse; and wherein the filtered signal is generated based on a comparison of the digital signal with: the first response template, and a second response template that represents a second known response of the vapor to a second type of target RF pulse.

Example 23. The method of example 22, wherein the first and second types of target RF pulses have different, non-overlapping ranges of field strength.

In some aspects of what is described, a non-transitory computer-readable medium may be described by the following examples:

Example 24. A non-transitory computer-readable medium comprising instructions that are operable, when executed by a data processing apparatus, to perform operations that comprise:

generating a digital signal that represents a measured response of a vapor to an RF field experienced by the vapor over a time period, the digital signal based on a detector signal from an optical detector over the time period, wherein:

the vapor resides in a vapor cell sensor configured to allow beams of light to pass through the vapor, the beams of light comprising a probe beam of light, and the optical detector is configured to receive the probe beam of light after the probe beam has passed through the vapor, and in response, generate the detector signal;

applying a matched filter to the digital signal to generate a filtered signal, the filtered signal generated based on a comparison of the digital signal with a response template, the response template representing a known response of the vapor to a target RF pulse; and processing the filtered signal to determine properties of the RF field experienced by the vapor over the time period.

Example 25. The non-transitory computer-readable medium of example 24, wherein applying a matched filter comprises applying a convolution function to the digital signal and the response template to generate the filtered signal.

Example 26. The non-transitory computer-readable medium of example 25, wherein a period of the response template for the convolution function is greater than an expected duration of a pulse of the RF field.

Example 27. The non-transitory computer-readable medium of example 24 or any one of examples 25-26, wherein processing the filtered signal comprises:

determining at least one of a start time, a duration, or an amplitude of an RF pulse experienced by the vapor in the time period.

Example 28. The non-transitory computer-readable medium of example 24 or any one of examples 25-27, generating a reference digital signal that represents a measured response of the vapor to reference RF pulses over a reference time period, the reference RF pulses sharing a common pulse shape; and generating the response template based on the reference digital signal.

Example 29. The non-transitory computer-readable medium of example 24 or any one of examples 25-27, wherein the response template is based on a computer simulation of a response of the vapor to the target RF pulse.

Example 30. The non-transitory computer-readable medium of example 24 or any one of examples 25-29, wherein the detector signal is based on at least one of an amplitude, a polarization, or a phase of the probe beam of light.

Example 31. The non-transitory computer-readable medium of example 24 or any one of examples 25-30, wherein the response template is a first response template that represents a first known response of the vapor to a first type of target RF pulse; and wherein the filtered signal is generated based on a comparison of the digital signal with: the first response template, and a second response template that represents a second known response of the vapor to a second type of target RF pulse.

Example 32. The non-transitory computer-readable medium of example 31, wherein the first and second types of target RF pulses have different, non-overlapping ranges of field strength.

In some aspects of what is described, a system may be described by the following examples:

Example 33. A system, comprising:
  a vapor cell sensor system comprising a vapor cell sensor;
  a radio frequency (RF) optic configured to direct an RF field onto the vapor cell sensor, the RF field comprising one or more RF pulses that define a radar signal, a communication signal, or other type of signal; and
  a signal processing system configured to perform operations that comprise:
    generating a digital signal based on a signal from the vapor cell sensor system, the digital signal representing a measured response of a vapor of the vapor cell sensor to the RF field over a time period,
    applying a matched filter to the digital signal to generate a filtered signal, the filtered signal generated based on a comparison of the digital signal with a response template, the response template representing a known response of the vapor to a target RF pulse, and
    processing the filtered signal to determine properties of the RF field sensed by the vapor cell sensor over the time period.

Example 34. The system of example 33, wherein the RF optic comprises a dish.

Example 35. The system of example 33 or example 34, wherein the RF optic comprises an RF lens.

Example 36. The system of example 33 or any one of examples 34-35, wherein processing the filtered signal comprises detecting a sequence of RF pulses.

Example 37. The system of example 33 or any one of examples 34-36, wherein the system is a radar system and the one more RF pulses define a radar signal.

Example 38. The system of example 37,
  wherein processing the filtered signal comprises detecting a sequence of RF pulses; and
  wherein the signal processing system is configured to identify an aircraft as a source of the sequence of RF pulses.

Example 39. The system of example 33 or any one of examples 34-36, wherein the system is a communication system and the one or more RF pulses define a communication signal.

Example 40. The system of example 39, wherein the signal processing system is configured to identify data represented by the communication signal.

Example 41. The system of example 33 or any one of examples 34-40, wherein the operations comprise:
  determining at least one of a start time, a duration, or an amplitude of an RF pulse sensed by the vapor cell sensor in the time period.

Example 42. The system of example 33 or any one of examples 34-41, wherein the response template is based on a plurality of reference RF pulses generated by an RF source over a reference time period, the plurality of reference RF pulses sharing a common pulse shape.

Example 43. The system of example 33 or any one of examples 34-41, wherein the response template is based on a computer simulation of a response of the vapor to the target RF pulse.

Example 44. The system of example 33 or any one of examples 34-43,
  wherein the response template is a first response template that represents a first known response of the vapor to a first type of target RF pulse; and
  wherein the filtered signal is generated based on a comparison of the digital signal with: the first response template, and
    a second response template that represents a second known response of the vapor to a second type of target RF pulse.

Example 45. The system of example 44, wherein the first and second types of target RF pulses have different, non-overlapping ranges of field strength.

Example 46. The system of example 33 or any one of examples 34-45, wherein the vapor comprises a vapor of Group IA atoms.

Example 47. The system of example 33 or any one of examples 34-46, wherein the vapor cell sensor system comprises a laser system configured to generate beams of light that pass through the vapor of the vapor cell sensor, the beams of light comprising a probe beam of light.

Example 48. The system of example 47, wherein the signal from the vapor cell sensor system is based on at least one of an amplitude, a polarization, or a phase of the probe beam of light.

Example 49. The system of example 33 or any one of examples 34-48,
  wherein the vapor cell sensor system comprises an optical detector and the signal from the vapor cell sensor system is a detector signal generated by the optical detector; and
  wherein the operations comprise receiving the detector signal at the signal processing system over the time period, the detector signal based on a probe beam of light that passes through a vapor of the vapor cell sensor.

In some aspects of what is described, a method of operating a system may be described by the following examples:

Example 50. A method of operating a system, comprising:
  directing a radio frequency (RF) field onto a vapor cell sensor of a vapor cell sensor system, the vapor cell sensor comprising a vapor, the RF field comprising one or more RF pulses that define a radar signal, a communication signal, or other type of signal; and
  by operation of the signal processing system:
    generating a digital signal based on a signal from the vapor cell sensor system, the digital signal representing a measured response of the vapor to the RF field over a time period,
    applying a matched filter to the digital signal to generate a filtered signal, the filtered signal generated based on a comparison of the digital signal with a response template, the response template representing a known response of the vapor to a target RF pulse, and
    processing the filtered signal to determine properties of the RF field experienced by the vapor over the time period.

Example 51. The method of example 50, wherein directing the RF field comprises:
  directing, by operation of a dish, the RF field onto a focal point of the dish, the vapor cell sensor being disposed at the focal point of the dish.

Example 52. The method of example 50 or example 51, wherein directing the RF field comprises:
  directing the RF field onto the vapor cell sensor by operation of an RF lens.

Example 53. The method of example 50 or any one of examples 51-52, wherein processing the filtered signal comprises detecting a sequence of RF pulses.

Example 54. The method of example 50 or any one of examples 51-53, wherein the system is a radar system and the one more RF pulses define a radar signal.

Example 55. The method of example 54,
wherein processing the filtered signal comprises detecting a sequence of RF pulses; and
wherein the method comprises identifying, by operation of the signal processing system, an aircraft as a source of the sequence of RF pulses.

Example 56. The method of example 50 or any one of examples 51-53, wherein the system is a communication system and the one or more RF pulses define a communication signal.

Example 57. The method of example 56, wherein the signal processing system is configured to identify data represented by the communication signal.

Example 58. The method of example 50 or any one of examples 51-57, wherein applying a matched filter comprises applying a convolution function to the digital signal and the response template to generate the filtered signal.

Example 59. The method of example 58, wherein a period of the response template for the convolution function is greater than an expected duration of an RF pulse of the RF field.

Example 60. The method of example 50 or any one of examples 51-59, comprising determining at least one of a start time, a duration, or an amplitude of an RF pulse sensed by the vapor cell sensor in the time period.

Example 61. The method of example 50 or any one of examples 51-60, comprising:
receiving reference pulses of the RF field at the vapor cell sensor over a reference time period, the reference pulses sharing a common pulse shape; and
generating, by operation of the signal processing system, the response template based on the digital signal associated with the reference pulses over the reference time period.

Example 62. The method of example 61, wherein generating the pulse template comprises:
determining, for each reference pulse, a pulse shape based on a portion of the digital signal associated with a duration of the reference pulse; and
averaging the pulse shapes to generate the response template.

Example 63. The method of example 50 or any one of examples 51-60, comprising:
generating the response template based on a computer simulation of a response of the vapor to the target RF pulse.

Example 64. The method of example 50 or any one of examples 51-63,
wherein the vapor cell sensor system comprises a laser system;
wherein the method comprises:
generating beams of light by operation of the laser system, and
passing the beams of light through the vapor in the vapor cell sensor, the beams of light comprising a probe beam of light; and
wherein the signal from the vapor cell sensor system is based on the probe beam of light after the probe beam has passed through the vapor.

Example 65. The method of example 64, wherein directing the RF field comprises:
altering, by operation of the RF field on the vapor, an optical transmission the probe beam of light through the vapor as the beams of light pass through the vapor.

Example 66. The method of example 64 or example 65, wherein the signal from the vapor cell sensor system is based on at least one of an amplitude, a polarization, or a phase of the probe beam of light.

Example 67. The method of example 64 or any one of examples 65-66,
wherein the vapor cell sensor system comprises an optical detector;
wherein the signal from the vapor cell sensor system is a detector signal from the optical detector, the detector signal based on the probe beam of light after the probe beam has passed through the vapor; and
wherein the method comprises receiving the detector signal at the signal processing system over the time period.

Example 68. The method of example 50 or any one of examples 51-67, wherein the vapor comprises a vapor of Group IA atoms.

Example 69. The method of example 50 or any one of examples 51-68,
wherein the response template is a first response template that represents a first known response of the vapor to a first type of target RF pulse; and
wherein the filtered signal is generated based on a comparison of the digital signal with: the first response template, and
a second response template that represents a second known response of the vapor to a second type of target RF pulse.

Example 70. The method of example 69, wherein the first and second types of target RF pulses have different, non-overlapping ranges of field strength.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:
1. A system comprising:
a laser system configured to generate beams of light that include a probe beam of light;
a vapor cell sensor having a vapor therein and configured to allow the beams of light to pass through the vapor;

an optical detector configured to generate a detector signal based on the probe beam of light after the probe beam has passed through the vapor; and a signal processing system configured to perform operations that comprise:
receiving the detector signal from the optical detector over a time period,
generating a digital signal based on the detector signal, the digital signal representing a measured response of the vapor to an RF field experienced by the vapor over the time period,
applying a matched filter to the digital signal to generate a filtered signal, the filtered signal generated based on a comparison of the digital signal with a response template, the response template representing a known response of the vapor to a target RF pulse, and
processing the filtered signal to determine properties of the RF field experienced by the vapor over the time period.

2. The system of claim 1, wherein processing the filtered signal comprises:
determining at least one of a start time, a duration, or an amplitude of an RF pulse experienced by the vapor in the time period.

3. The system of claim 1, comprising:
a source of the RF field that is configured to produce RF pulses;
wherein the response template is based on a plurality of reference RF pulses generated by the source over a reference time period, the plurality of reference RF pulses defining the RF field and sharing a common pulse shape.

4. The system of claim 1, wherein the response template is based on a computer simulation of a response of the vapor to the target RF pulse.

5. The system of claim 1, wherein the signal processing system comprises a high pass filter configured to block a portion of the detector signal that has a frequency less than a threshold frequency.

6. The system of claim 5, wherein the threshold frequency is less than or equal to 100 Hz.

7. The system of claim 1,
wherein the response template is a first response template that represents a first known response of the vapor to a first type of target RF pulse; and
wherein the filtered signal is generated based on a comparison of the digital signal with:
the first response template, and
a second response template that represents a second known response of the vapor to a second type of target RF pulse.

8. The system of claim 7, wherein the first and second types of target RF pulses have different, non-overlapping ranges of field strength.

9. The system of claim 1, wherein the detector signal is based on at least one of an amplitude, a polarization, or a phase of the probe beam of light.

10. A method comprising:
passing beams of light through a vapor in a vapor cell sensor, the beams of light comprising a probe beam of light;
allowing an RF field to interact with the vapor;
generating, by operation of an optical detector, a detector signal that is based on the probe beam of light after the probe beam has passed through the vapor;
receiving the detector signal at a signal processing system over a time period; and
by operation of the signal processing system:
generating a digital signal based on the detector signal, the digital signal representing a measured response of the vapor to the RF field over the time period,
applying a matched filter to the digital signal to generate a filtered signal, the filtered signal generated based on a comparison of the digital signal with a response template, the response template representing a known response of the vapor to a target RF pulse, and
processing the filtered signal to determine properties of the RF field experienced by the vapor over the time period.

11. The method of claim 10, wherein applying a matched filter comprises applying a convolution function to the digital signal and the response template to generate the filtered signal.

12. The method of claim 11, wherein a period of the response template for the convolution function is greater than an expected duration of a pulse of the RF field.

13. The method of claim 10, wherein processing the filtered signal comprises:
determining at least one of a start time, a duration, or an amplitude of an RF pulse experienced by the vapor in the time period.

14. The method of claim 10, comprising:
allowing reference RF pulses to interact with the vapor, the reference RF pulses sharing a common pulse shape;
receiving a reference detector signal at the signal processing system over a reference time period; and
by operation of the signal processing system:
generating a reference digital signal based on the reference detector signal, the reference digital signal representing a measured response of the vapor to the reference RF pulses over the reference time period, and
generating the response template based on the reference digital signal.

15. The method of claim 14, wherein generating the response template comprises:
determining, for each reference pulse, a pulse shape based on a portion of the digital signal associated with a duration of the reference pulse; and
averaging the pulse shapes to generate the response template.

16. The method of claim 10, comprising:
generating the response template based on a computer simulation of a response of the vapor to the target RF pulse.

17. The method of claim 10, wherein the detector signal is based on at least one of an amplitude, a polarization, or a phase of the probe beam of light.

18. The method of claim 10, comprising:
filtering the detector signal to remove a portion that has a frequency less than a threshold frequency, the threshold frequency less than or equal to 100 Hz.

19. The method of claim 10, wherein interacting the RF field comprises interacting the RF field with the vapor during at least part of the time period.

20. The method of claim 10, comprising:
allowing a heterodyne RF field to interact with the vapor, the heterodyne RF field comprising a continuous wave (CW) RF field over the time period;

wherein the digital signal represents a measured response of the vapor to a mixed RF field over the time period, the mixed RF field comprising the heterodyne RF field and the RF field; and wherein processing the filtered signal comprises processing the filtered signal to determine properties of the mixed RF field experienced by the vapor over the time period.

21. The method of claim 10, wherein the response template is a first response template that represents a first known response of the vapor to a first type of target RF pulse; and wherein the filtered signal is generated based on a comparison of the digital signal with:

the first response template, and a second response template that represents a second known response of the vapor to a second type of target RF pulse.

22. The method of claim 21, wherein the first and second types of target RF pulses have different, non-overlapping ranges of field strength.

23. A non-transitory computer-readable medium comprising instructions that are operable, when executed by a data processing apparatus, to perform operations that comprise:

generating a digital signal that represents a measured response of a vapor to an RF field experienced by the vapor over a time period, the digital signal based on a detector signal from an optical detector over the time period, wherein:

the vapor resides in a vapor cell sensor configured to allow beams of light to pass through the vapor, the beams of light comprising a probe beam of light, and the optical detector is configured to receive the probe beam of light after the probe beam has passed through the vapor, and in response, generate the detector signal;

applying a matched filter to the digital signal to generate a filtered signal, the filtered signal generated based on a comparison of the digital signal with a response template, the response template representing a known response of the vapor to a target RF pulse; and processing the filtered signal to determine properties of the RF field experienced by the vapor over the time period.

24. The non-transitory computer-readable medium of claim 23, wherein applying a matched filter comprises applying a convolution function to the digital signal and the response template to generate the filtered signal.

25. The non-transitory computer-readable medium of claim 23, wherein processing the filtered signal comprises:

determining at least one of a start time, a duration, or an amplitude of an RF pulse experienced by the vapor in the time period.

26. The non-transitory computer-readable medium of claim 23, wherein the operations comprise:

generating a reference digital signal that represents a measured response of the vapor to reference RF pulses over a reference time period, the reference RF pulses sharing a common pulse shape; and generating the response template based on the reference digital signal.

27. The non-transitory computer-readable medium of claim 23, wherein the response template is based on a computer simulation of a response of the vapor to the target RF pulse.

28. The non-transitory computer-readable medium of claim 23, wherein the detector signal is based on at least one of an amplitude, a polarization, or a phase of the probe beam of light.

29. The non-transitory computer-readable medium of claim 23, wherein the response template is a first response template that represents a first known response of the vapor to a first type of target RF pulse; and wherein the filtered signal is generated based on a comparison of the digital signal with:

the first response template, and a second response template that represents a second known response of the vapor to a second type of target RF pulse.

30. The non-transitory computer-readable medium of claim 29, wherein the first and second types of target RF pulses have different, non-overlapping ranges of field strength.

* * * * *

UNITED STATES PATENT AND TRADEMARK OFFICE
CERTIFICATE OF CORRECTION

PATENT NO. : 11,885,904 B2
APPLICATION NO. : 18/068146
DATED : January 30, 2024
INVENTOR(S) : Bohaichuk et al.

It is certified that error appears in the above-identified patent and that said Letters Patent is hereby corrected as shown below:

In the Specification

Column 1, Line 37 After "a" insert -- 10-µs -- therefor
Column 1, Line 39 After "a" insert -- 10-µs -- therefor
Column 1, Line 44 After second occurrence of "a" insert -- 10-µs --
Column 1, Line 56 After "us" insert -- 10-µs -- therefor
Column 1, Line 57 After "us" insert -- 10-µs -- therefor
Column 2, Line 18 Delete "us" and insert -- µs -- therefor
Column 2, Line 43 Delete "us" and insert -- µs -- therefor
Column 2, Line 44 Delete "–170 µV/cm." and insert -- ~170µV/cm. -- therefor
Column 4, Line 8 Delete "us" and insert -- µs -- therefor
Column 10, Line 3 Delete "us" and insert -- µs -- therefor
Column 10, Line 60 Delete "$\Delta_4=\Delta_c=0.$" and insert -- $\Delta_p=\Delta_c=0.$ -- therefor
Column 11, Line 12 Delete "14>" and insert -- |4> -- therefore
Column 12, Line 59 Delete "us" and insert -- µs -- therefor
Column 13, Line 23 Delete "us" and insert -- µs -- therefor
Column 14, Line 2 Delete "us" and insert -- µs -- therefor
Column 14, Line 3 Delete "us" and insert -- µs -- therefor
Column 14, Line 44 After "and" insert -- 10-µs -- therefor
Column 15, Line 8 Delete "us" and insert -- µs -- therefor
Column 15, Line 25 After "or" insert -- 10-µs -- therefor
Column 19, Line 5 Delete "us" and insert -- µs -- therefor
Column 19, Line 7 Delete "us" and insert -- µs -- therefor
Column 19, Line 29 Delete "$58S_{1/2} \chi 58P_{3/2}$" insert -- $58S_{1/2} \leftrightarrow 58P_{3/2}$ -- therefor
Column 19, Line 55 Delete "us" and insert -- µs -- therefor
Column 19, Line 55 Delete "us" and insert -- µs -- therefor Signed and Sealed this
Sixteenth Day of April, 2024

Katherine Kelly Vidal
*Director of the United States Patent and Trademark Office*

Page 1 of 1